(12) United States Patent
Choi

(10) Patent No.: US 12,557,284 B2
(45) Date of Patent: Feb. 17, 2026

(54) SEMICONDUCTOR MEMORY DEVICE AND METHOD OF MANUFACTURING SEMICONDUCTOR MEMORY DEVICE

(71) Applicant: SK hynix Inc., Icheon-si (KR)

(72) Inventor: Kang Sik Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 600 days.

(21) Appl. No.: 17/951,468

(22) Filed: Sep. 23, 2022

(65) Prior Publication Data

US 2023/0309305 A1  Sep. 28, 2023

(30) Foreign Application Priority Data

Mar. 22, 2022  (KR) .......................... 10-2022-0035597

(51) Int. Cl.
| | |
|---|---|
| *H10B 43/27* | (2023.01) |
| *H01L 23/528* | (2006.01) |
| *H10B 43/10* | (2023.01) |
| *H10B 43/40* | (2023.01) |

(52) U.S. Cl.
CPC ......... *H10B 43/27* (2023.02); *H01L 23/5283* (2013.01); *H10B 43/10* (2023.02); *H10B 43/40* (2023.02)

(58) Field of Classification Search
CPC ........ H10B 43/27; H10B 43/10; H10B 43/40; H10B 41/27; H10B 41/50; H10B 43/50; H10B 43/30; H10B 41/02; H01L 23/5283
See application file for complete search history.

(56) References Cited

U.S. PATENT DOCUMENTS

| | | | | |
|---|---|---|---|---|
| 11,538,859 | B2* | 12/2022 | Lee | H10N 70/8825 |
| 12,108,598 | B2* | 10/2024 | Yamabe | H10B 43/40 |
| 2014/0357054 | A1 | 12/2014 | Son et al. | |
| 2019/0296041 | A1 | 9/2019 | Yamasaka et al. | |
| 2021/0028188 | A1* | 1/2021 | Kim | H10B 43/27 |
| 2021/0036002 | A1* | 2/2021 | Lee | H10B 43/27 |
| 2022/0302141 | A1* | 9/2022 | Watanabe | H10B 43/35 |
| 2022/0415920 | A1* | 12/2022 | Yamasaka | H10B 43/35 |
| 2023/0389315 | A1* | 11/2023 | Oh | H10D 64/037 |

FOREIGN PATENT DOCUMENTS

| | | |
|---|---|---|
| KR | 1020170027561 A | 3/2017 |
| KR | 1020190107975 A | 9/2019 |
| KR | 1020200011852 A | 2/2020 |
| KR | 1020200125148 A | 11/2020 |
| KR | 1020220000254 A | 1/2022 |

* cited by examiner

*Primary Examiner* — Steven B Gauthier
*Assistant Examiner* — Khatib A Rahman
(74) *Attorney, Agent, or Firm* — WILLIAM PARK AND ASSOCIATES LTD.

(57) ABSTRACT

The present disclosure provides a semiconductor memory device and a method of manufacturing the same. The semiconductor memory device includes a channel layer including a plurality of channel pillars that pass through a gate stack and a channel connection portion that extends from each of the plurality of channel pillars to overlap with the gate stack, a memory layer including a vertical portion between the plurality of channel pillars and the gate stack and a horizontal portion that extends from the vertical portion between the gate stack and the channel connection portion, and a doped semiconductor layer contacting the channel connection portion and overlapping with the channel connection portion.

19 Claims, 36 Drawing Sheets

FIG. 4

SEMICONDUCTOR MEMORY DEVICE AND METHOD OF MANUFACTURING SEMICONDUCTOR MEMORY DEVICE

CROSS-REFERENCE TO RELATED APPLICATION

The present application claims priority under 35 U.S.C. § 119(a) to Korean patent application number 10-2022-0035597, filed on Mar. 22, 2022, in the Korean Intellectual Property Office, the entire disclosure of which is incorporated herein by reference.

BACKGROUND

1. Technical Field

Various embodiments of the present disclosure relate to a semiconductor memory device and a method of manufacturing a semiconductor memory device, and more particularly, to a three-dimensional semiconductor memory device and a method of manufacturing a three-dimensional semiconductor memory device.

2. Related Art

A semiconductor memory device includes memory cells capable of storing data. A three-dimensional semiconductor memory device may include a three-dimensional memory cell array.

In order to improve an integration degree of the three-dimensional memory cell array, the number of stacks of memory cells may be increased. As the number of stacks of the memory cells increases, a manufacturing process of the semiconductor memory device may become more complicated, and stability of the manufacturing process may deteriorate. Accordingly, operation reliability of the semiconductor memory device may deteriorate.

SUMMARY

According to an embodiment of the present disclosure, a semiconductor memory device may include a gate stack including a plurality of conductive patterns stacked and spaced apart from each other, a channel layer including a plurality of channel pillars that pass through the gate stack and a channel connection portion that extends from each of the plurality of channel pillars to overlap with the gate stack, a memory layer including a vertical portion between the plurality of channel pillars and the gate stack and a horizontal portion that extends from the vertical portion between the gate stack and the channel connection portion, and a doped semiconductor layer contacting the channel connection portion and overlapping with the channel connection portion.

According to an embodiment of the present disclosure, a semiconductor memory device may include a first gate stack, a second gate stack spaced apart from the first gate stack, a slit insulating layer between the first gate stack and the second gate stack, a first channel layer including a plurality of first channel pillars that pass through the first gate stack and a first channel connection portion that extends from the plurality of first channel pillars to overlap with the first gate stack, a second channel layer including a plurality of second channel pillars that pass through the second gate stack and a second channel connection portion that extends from the plurality of second channel pillars to overlap with the second gate stack, a first memory layer including a first vertical portion between the plurality of first channel pillars and the first gate stack and a first horizontal portion extending from the first vertical portion between the first gate stack and the first channel connection portion, a second memory layer including a second vertical portion between the plurality of second channel pillars and the second gate stack and a second horizontal portion extending from the second vertical portion between the second gate stack and the second channel connection portion, and a doped semiconductor layer disposed over the slit insulating layer, the first channel layer, and the second channel layer, the doped semiconductor layer extending to contact the first channel connection portion of the first channel layer and the second channel connection portion of the second channel layer.

According to an embodiment of the present disclosure, a method of manufacturing a semiconductor memory device may include forming a plurality of supports that are disposed to be spaced apart from each other along an upper surface of a lower structure, forming a memory cell array that includes a gate stack disposed over the plurality of supports and including a plurality of channel holes; a memory layer including a horizontal portion that extends along a surface of an opening between the gate stack and the lower structure and including a vertical portion that extends from the horizontal portion along a sidewall of each of the channel holes; and a channel layer including a channel connection portion that extends along a surface of the horizontal portion of the memory layer and including a channel pillar that extends from the channel connection portion along a surface of the vertical portion of the memory layer, removing the lower structure, removing a portion of the horizontal portion of the memory layer to expose the channel connection portion of the channel layer, and forming a doped semiconductor layer over the channel connection portion of the channel layer.

BRIEF DESCRIPTION OF THE DRAWINGS

FIG. 4 is a cross-sectional view illustrating a semiconductor memory device according to an embodiment of the present disclosure.

DETAILED DESCRIPTION

Specific structural or functional descriptions disclosed below are exemplified to describe an embodiment according to the concept of the present disclosure. The embodiment according to the concept of the present disclosure is not construed as being limited to the embodiments described below, and may be variously modified and replaced with other equivalent embodiments.

Hereinafter, terms such as first and second may be used to describe various components, but the components are not limited by the terms. The terms are used for the purpose of distinguishing one component from another component, and an order or the number of components is not limited by the terms.

Various embodiments of the present disclosure may provide a semiconductor memory device and a method of manufacturing the same capable of improving operational reliability.

Figure 1:
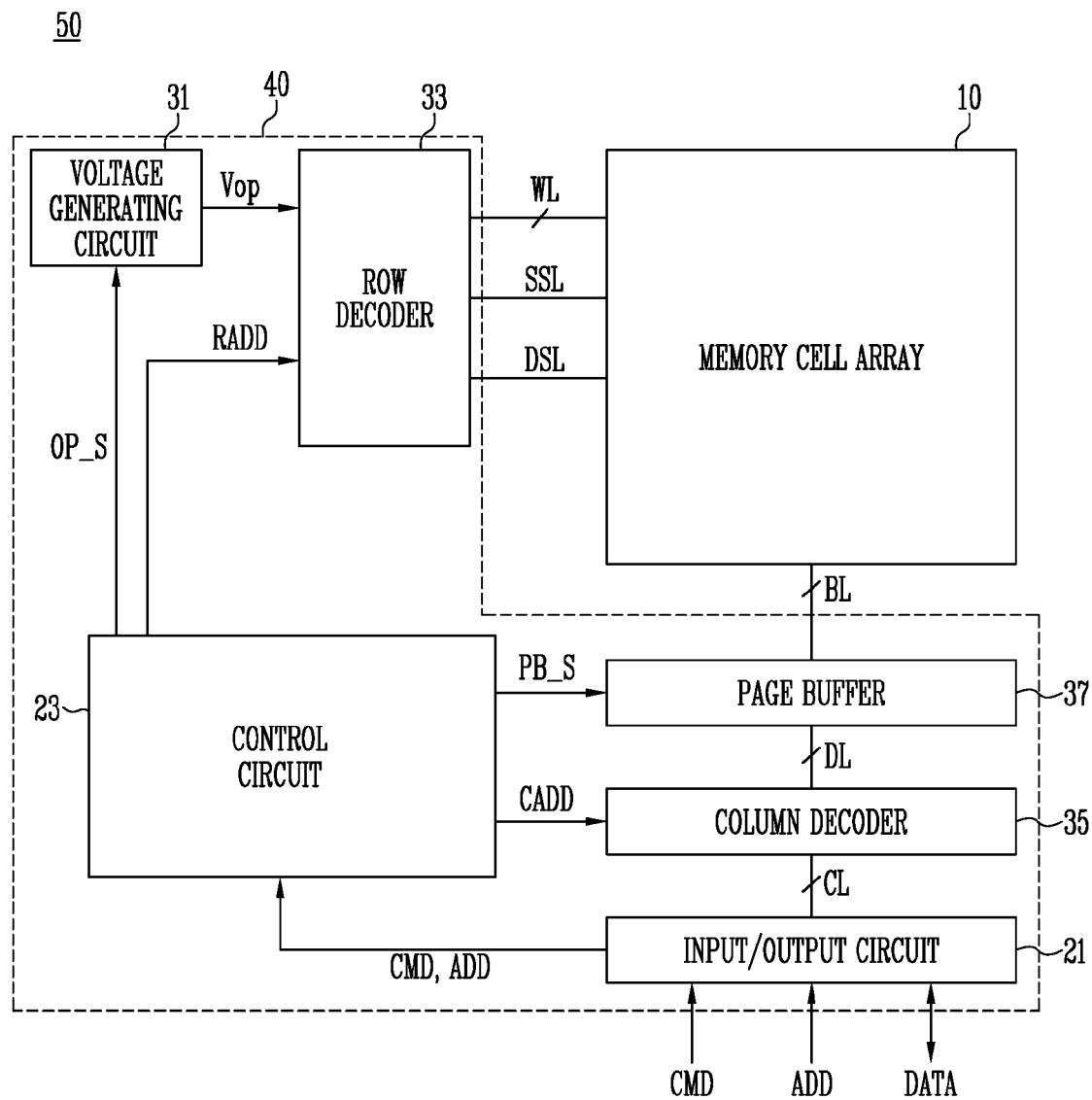
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, the semiconductor memory device 50 may include a peripheral circuit structure 40 and a memory cell array 10.

The peripheral circuit structure 40 may be configured to perform a program operation that stores data in the memory cell array 10, a read operation that outputs data that is stored in the memory cell array 10, and an erase operation for erasing data that is stored in the memory cell array 10. As an embodiment, the peripheral circuit structure 40 may include an input/output circuit 21, a control circuit 23, a voltage generating circuit 31, a row decoder 33, a column decoder 35, and a page buffer 37.

The memory cell array 10 may be connected to a drain select line DSL, a word line WL, a source select line SSL, and a bit line BL.

The input/output circuit 21 may transmit a command CMD and an address ADD that are received from an external device (for example, a memory controller) of the semiconductor memory device 50 to the control circuit 23. The input/output circuit 21 may exchange data DATA with the external device and the column decoder 35.

The control circuit 23 may output an operation signal OP_S, a row address RADD, a page buffer control signal PB_S, and a column address CADD in response to the command CMD and the address ADD.

The voltage generating circuit 31 may generate various operation voltages Vop that are used for the program operation, the read operation, and the erase operation in response to the operation signal OP_S.

The row decoder 33 may transmit the operation voltages Vop to the drain select line DSL, the word line WL, and the source select line SSL in response to the row address RADD.

In response to the column address CADD, the column decoder 35 may transmit the data DATA that is input from the input/output circuit 21 to the page buffer 37 or transmit the data DATA that is stored in the page buffer 37 to the input/output circuit 21. The column decoder 35 may exchange the data DATA with the input/output circuit 21 through column lines CL. The column decoder 35 may exchange the data DATA with the page buffer 37 through data lines DL.

The page buffer 37 may temporarily store the data DATA that is received through the bit line BL in response to the page buffer control signal PB_S. The page buffer 37 may sense a voltage or a current of the bit line BL during the read operation.

Figure 2:
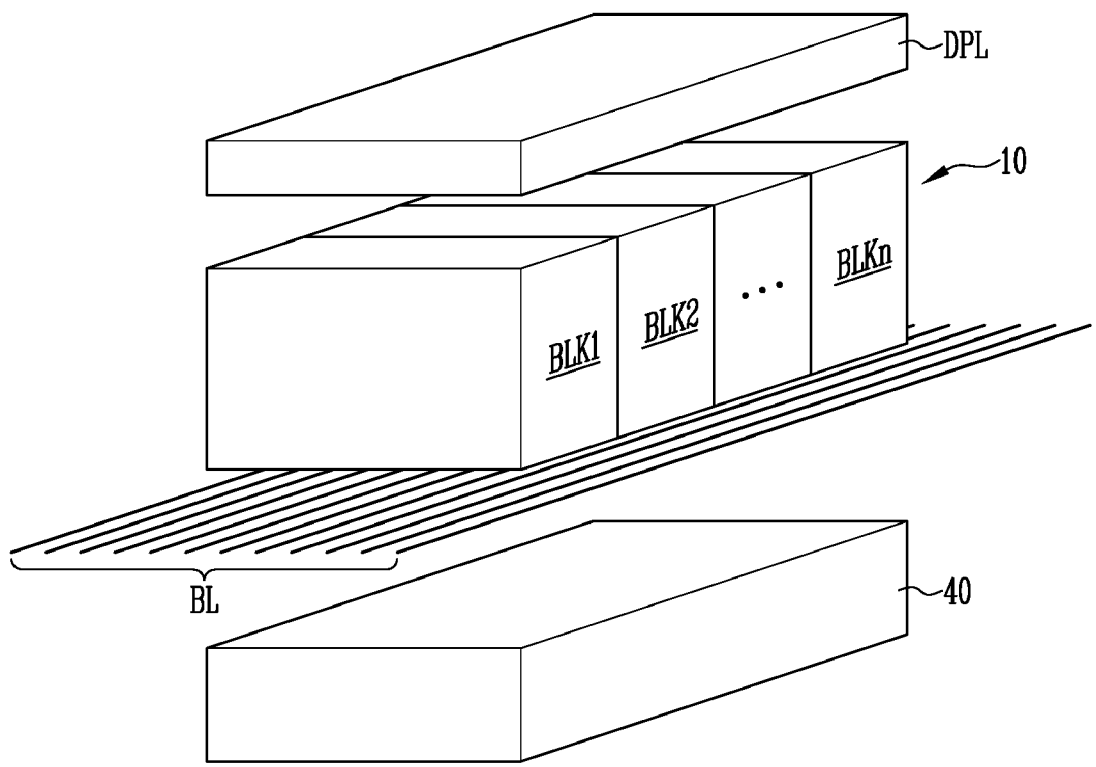
FIG. 2 is a diagram schematically illustrating a semiconductor memory device according to an embodiment of the present disclosure.

FIG. 2 is a diagram schematically illustrating a semiconductor memory device according to an embodiment of the present disclosure.

Referring to FIG. 2, the memory cell array 10 may overlap with a portion of the peripheral circuit structure 40. The memory cell array 10 may include a plurality of memory blocks BLK1 to BLKn (n is a natural number equal to or greater than 2). Each of the memory blocks BLK1 to BLKn may include a plurality of memory cells that are arranged in a three-dimension. As an embodiment, each of the memory blocks BLK1 to BLKn may include a plurality of memory cell strings that are arranged to be spaced apart from each other along an X-axis direction and a Y-axis direction, and each memory cell string may include a plurality of memory cells that are arranged in a Z-axis direction.

The plurality of memory cell strings of the memory cell array 10 may be connected to a plurality of bit lines BL and a doped semiconductor layer DPL. The plurality of bit lines BL may be disposed between the memory cell array 10 and the peripheral circuit structure 40. The doped semiconductor layer DPL may overlap with the peripheral circuit structure 40 with the memory cell array 10 interposed therebetween. The doped semiconductor layer DPL may include at least one of an n-type impurity and a p-type impurity.

A process of forming the peripheral circuit structure may be performed separately from a process of forming the memory cell array 10. At this time, the peripheral circuit structure 40 and the memory cell array 10 may be electrically connected to each other through a bonding process. The peripheral circuit structure 40 and the memory cell array 10 may be electrically connected to each other through a plurality of interconnections and a plurality of conductive bonding pads. Although not shown in FIG. 2, the plurality of interconnections and the plurality of conductive bonding pads may be disposed between the plurality of bit lines BL and the peripheral circuit structure 40.

Each memory cell string of the memory cell array 10 may include at least one source select transistor, at least one drain select transistor, and a plurality of memory cells that are connected in series between the source select transistor and the drain select transistor. A plurality of conductive patterns of a gate stack may be used as gates of the source select transistor, the drain select transistor, and the memory cell.

Figure 3:
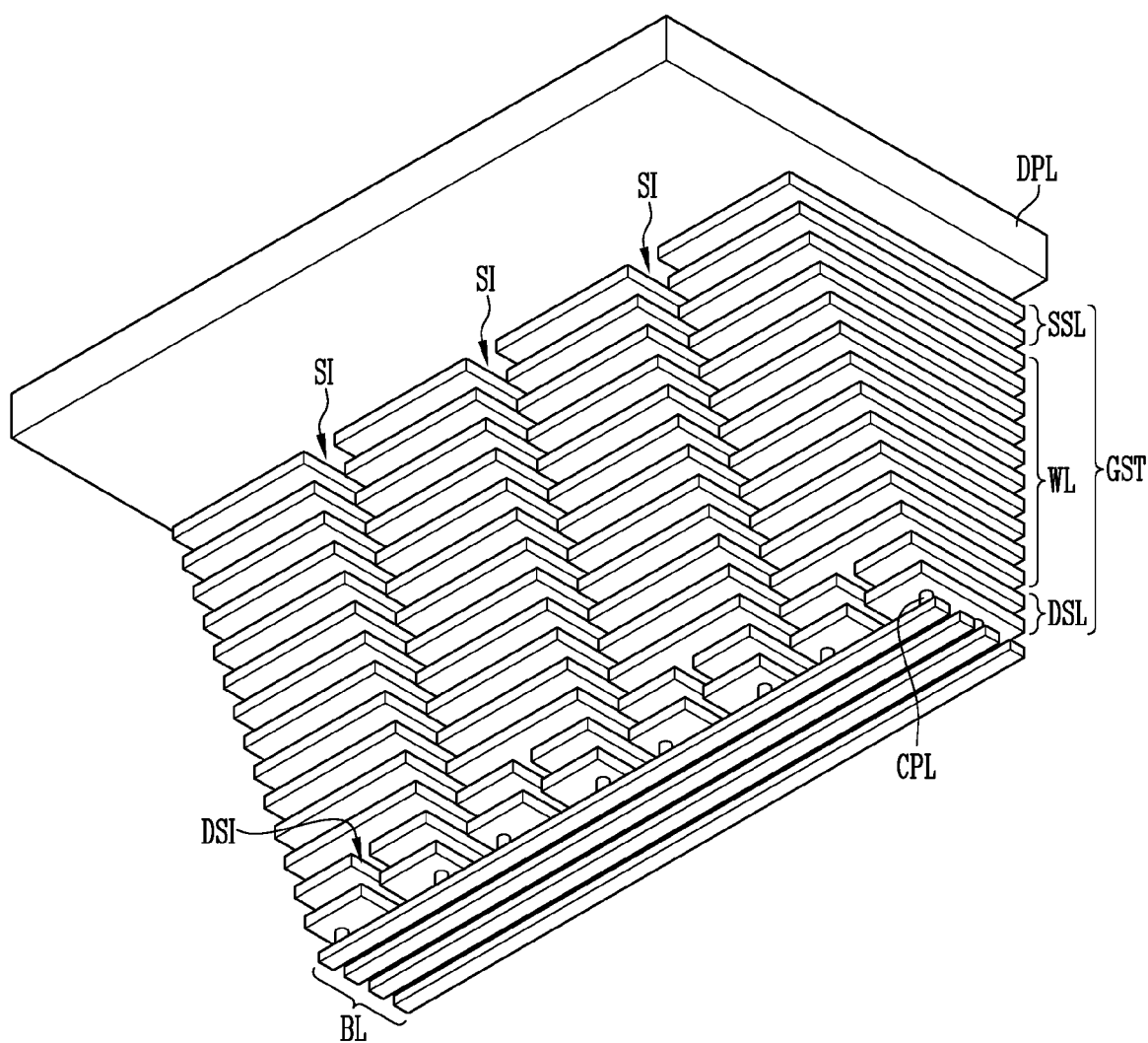
FIG. 3 is a perspective view illustrating a semiconductor memory device according to an embodiment of the present disclosure.

FIG. 3 is a perspective view illustrating a semiconductor memory device according to an embodiment of the present disclosure.

Referring to FIG. 3, the semiconductor memory device may include a plurality of gate stacks GST that are partitioned by a slit SI. The plurality of gate stacks GST may be disposed between the plurality of bit lines BL and the doped semiconductor layer DPL.

Each gate stack GST may surround a plurality of cell plugs CPL. Each of the cell plugs CPL may include a channel pillar of a channel layer and a vertical portion of a memory layer. A structure of the channel pillar of the channel layer and the vertical portion of the memory layer is described later with reference to FIG. 4.

Each gate stack GST may include a plurality of conductive patterns DSL, WL, and SSL that are stacked apart from each other. The plurality of conductive patterns DSL, WL, and SSL may include at least one drain select line DSL, a plurality of word lines WL, and at least one source select line SSL. As an embodiment, the plurality of cell plugs CPL may include a first group of cell plug and a second group of cell plug that may be individually controlled by two rows of drain select lines DSL that are separated from each other by a drain separation slit DSI. At this time, each of the plurality of word lines WL and the source select line SSL may successively extend to overlap with the two rows of drain select lines DSL and may surround the first group of cell plug and the second group of cell plug. Accordingly, the first group of cell plug and the second group of cell plug may be simultaneously controlled by each of the word lines WL and the source select line SSL. An embodiment of the present disclosure is not limited thereto. As an embodiment, the plurality of cell plugs CPL may be divided into three or more groups that may be individually controlled by three or more rows of drain select lines that are separated from each other by the drain separation slit DSI. As another embodiment, the plurality of cell plugs CPL may be divided into two or more groups that may be individually controlled by two or more rows of source select lines that are separated from each other by a source separation slit.

Each drain select line DSL may be used as a gate of the drain select transistor. Each word line WL may be used as a gate of the memory cell. Each source select line SSL may be used as a gate of the source select transistor.

The plurality of word lines WL may be disposed between the drain select line DSL and the source select line SSL. The drain select line DSL may be disposed in at least one layer between the plurality of word lines WL and the plurality of bit lines BL. The source select line SSL may be disposed in at least one layer between the plurality of word lines WL and the doped semiconductor layer DPL.

Figure 4:
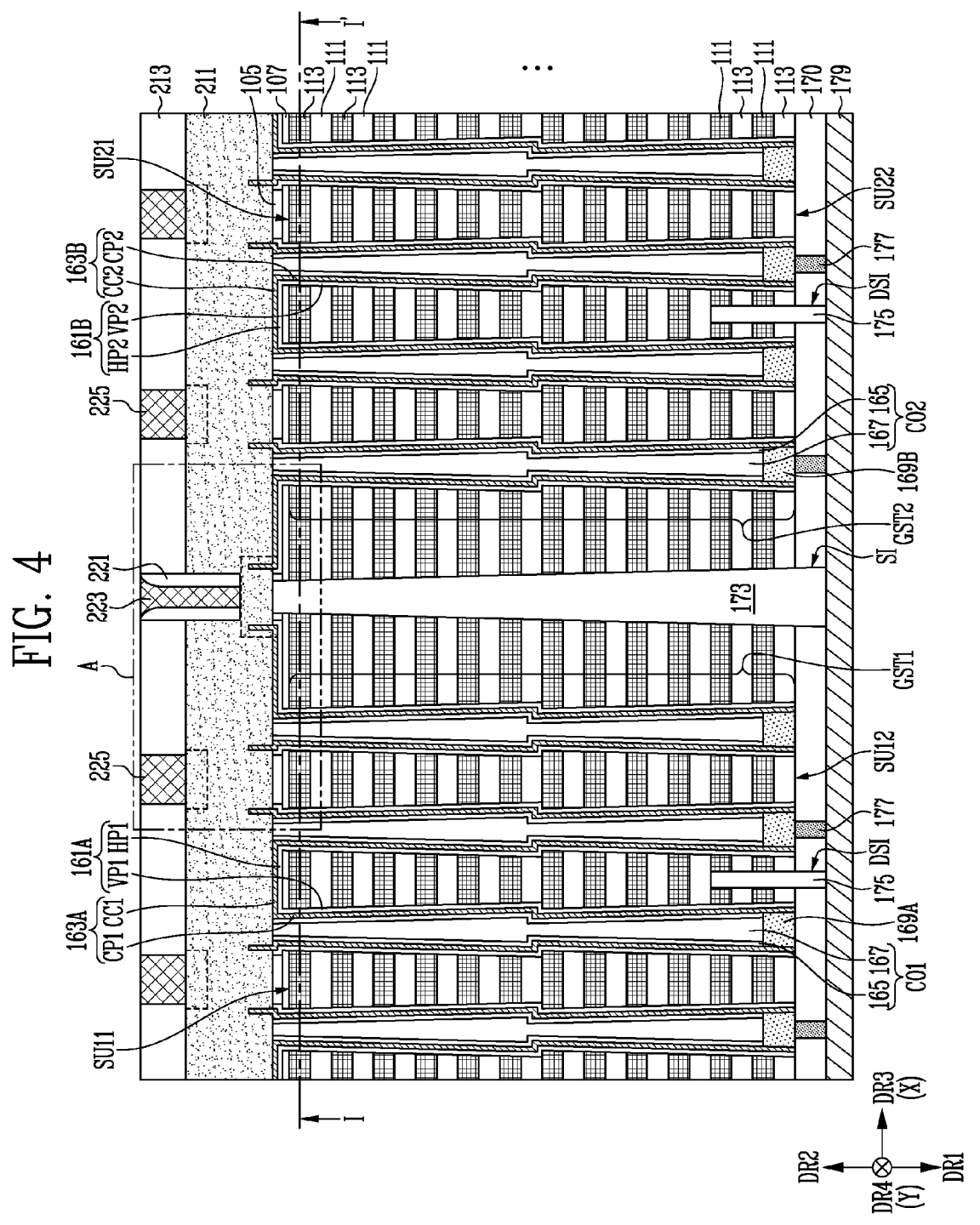
Figure 5:
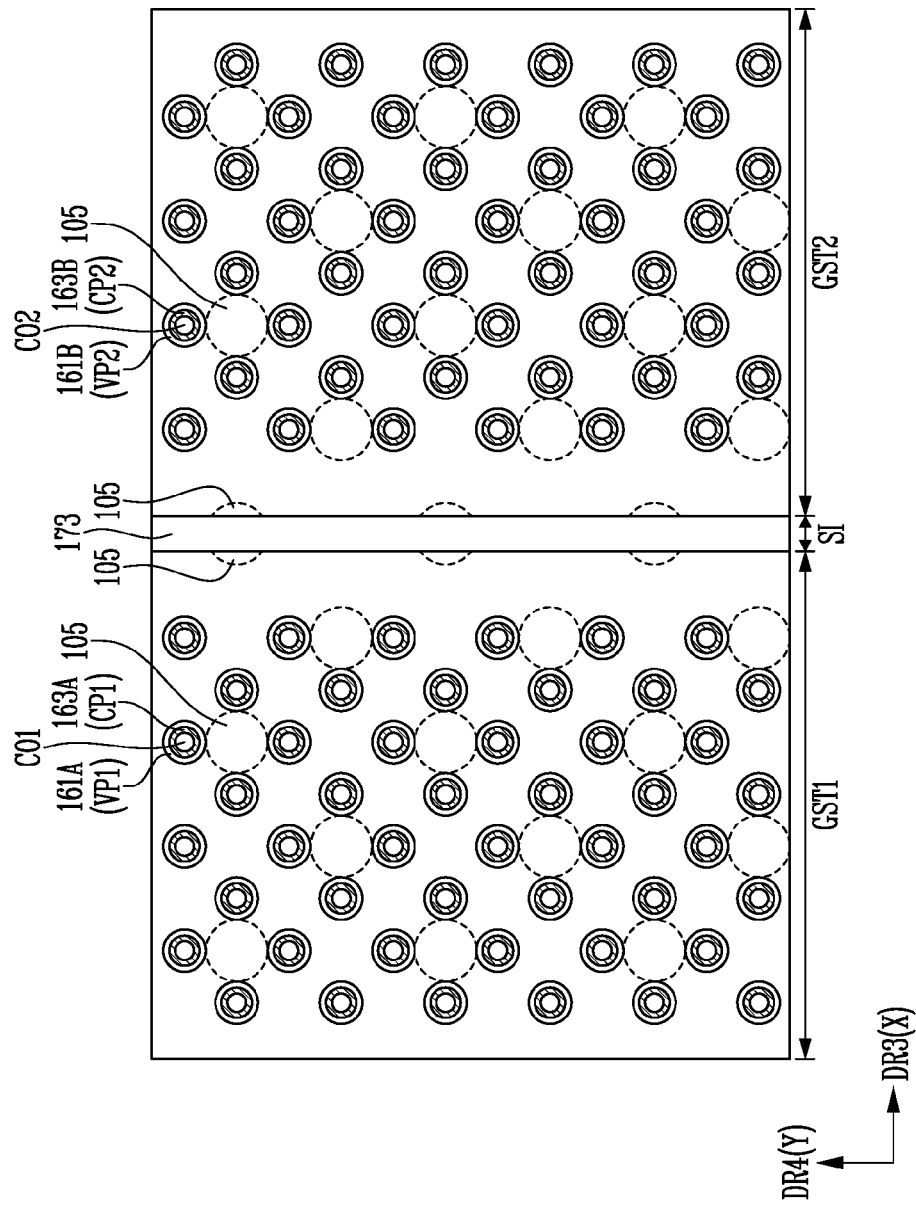
FIG. 5 is a plan view of the semiconductor memory device taken along a line I-I' shown in FIG. 4.

FIG. 4 is a cross-sectional view illustrating a semiconductor memory device according to an embodiment of the present disclosure. FIG. 5 is a plan view of the semiconductor memory device taken along a line I-I' shown in FIG. 4.

Referring to FIGS. 4 and 5, the memory cell array of the semiconductor memory device may include a first gate stack GST1, a second gate stack GST2, a first memory layer 161A, a second memory layer 161B, a first channel layer 163A, and a second channel layer 163B.

The first gate stack GST1 and the second gate stack GST2 may be spaced apart from each other by a slit SI. A slit insulating layer 173 may be disposed in the slit SI.

Each of the first gate stack GST1 and the second gate stack GST2 may include a plurality of conductive patterns 111 that are stacked apart from each other in a first direction DR1. The plurality of conductive patterns 111 may include at least one of a doped semiconductor layer, a metal layer, and a conductive metal nitride layer. The doped semiconductor layer may include a doped silicon layer. The metal layer may include tungsten, copper, molybdenum, or the like. The conductive metal nitride layer may include titanium nitride, tantalum nitride, or the like.

Each of the first gate stack GST1 and the second gate stack GST2 may include a plurality of interlayer insulating layers 113 that are alternately disposed in the first direction DR1 with the plurality of conductive patterns 111. The plurality of conductive patterns 111 of the first gate stack GST1 may be insulated from the plurality of conductive patterns 111 of the second gate stack GST2 by the slit insulating layer 173.

Each of the first gate stack GST1 and the second gate stack GST2 may include a first surface SU11 or SU21 that faces the first direction DR1 and a second surface SU12 or SU22 that faces a second direction DR2, the second direction DR2 being opposite to the first direction DR1. The doped semiconductor layer 211 of the semiconductor memory device may overlap with the first surface SU11 of the first gate stack GST1 and the first surface SU21 of the second gate stack GST2. The second surface SU12 of the first gate stack GST1 and the second surface SU22 of the second gate stack GST2 may overlap with a bit line 179 with a first insulating layer 170 that is interposed therebetween.

Among the plurality of conductive patterns 111, a conductive pattern of at least one layer that is adjacent to the doped semiconductor layer 211 may be used as the source select line SSL shown in FIG. 3. Among the plurality of conductive patterns 111, a conductive pattern of at least one layer that is adjacent to the bit line 179 may be used as the drain select line DSL shown in FIG. 3. Conductive patterns that are used as the drain select line may be separated from each other at the same level by the drain separation slit DSI. A separation insulating layer 175 may be disposed inside the drain separation slit DSI. The drain select lines of the same level may be insulated from each other by the separation insulating layer 175.

A plurality of supports 105 may be disposed between the doped semiconductor layer 211 and the first gate stack GST1 and between the doped semiconductor layer 211 and the second gate stack GST2. The plurality of supports 105 may be disposed to be spaced apart from each other along the first surface SU11 of the first gate stack GST1 and the first surface SU21 of the second gate stack.

The first channel layer 163A and the second channel layer 163B may include a single layer or double layers, formed of a semiconductor material, such as silicon or germanium.

The first channel layer 163A may include a plurality of first channel pillars CP1 and a first channel connection portion CC1 that extends from the plurality of first channel pillars CP1. The plurality of first channel pillars CP1 may extend in the first direction DR1 to pass through the first gate stack GST1. The first channel connection portion CC1 may extend along a plane that crosses the plurality of first channel pillars CP1 to overlap with the first surface SU11 of the first gate stack GST1. As an embodiment, the first channel connection portion CC1 may extend along an XY plane.

The second channel layer 163B may include a plurality of second channel pillars CP2 and a second channel connection portion CC2 that extends from the plurality of second channel pillars CP2. The plurality of second channel pillars CP2 may extend in the first direction DR1 to pass through the second gate stack GST2. The second channel connection portion CC2 may extend along a plane that crosses the plurality of second channel pillars CP2 to overlap with the first surface SU21 of the second gate stack GST2. As an embodiment, the second channel connection portion CC2 may extend along the XY plane.

Each of the first channel pillar CP1 and the second channel pillar CP2 may be formed in a tubular shape. In this case, a first core insulating structure CO1 and a first capping pattern 169A may be disposed in a central area of the first channel pillar CP1, and a second core insulating structure CO2 and a second capping pattern 169B may be disposed in a central area of the second channel pillar CP2.

Each of the first core insulating structure CO1 and the second core insulating structures CO2 may include a buffer layer 165 and a gap fill layer 167. The gap fill layer 167 may be surrounded by a corresponding first channel layer 163A or second channel layer 163B. The buffer layer 165 may be disposed between each of the first channel layer 163A and the second channel layer 163B and the gap fill layer 167. The gap fill layer 167 and the buffer layer 165 may be formed of insulating materials of different qualities. As an embodiment, the buffer layer 165 may be formed of an insulating material that is denser than the gap fill layer 167.

The first capping pattern 169A and the second capping pattern 169B may be formed of a doped semiconductor layer that includes at least one of an n-type impurity and a p-type impurity. As an embodiment, the first capping pattern 169A and the second capping pattern 169B may include an n-type impurity as a majority carrier. As an embodiment, the first capping pattern 169A and the second capping pattern 169B may be formed of an n-type doped silicon layer. A sidewall of the first capping pattern 169A may be surrounded by an end of the first channel layer 163A that faces the bit line 179 and may be in contact with the end of the first channel layer 163A. A sidewall of the second capping pattern 169B may be surrounded by an end of the second channel layer 163B that faces the bit line 179 and may be in contact with the end of the second channel layer 163B.

The first memory layer 161A may include a plurality of first vertical portions VP1 and a first horizontal portion HP1 that extends from the plurality of first vertical portions VP1. The plurality of first vertical portions VP1 may surround sidewalls of the plurality of first channel pillars CP1, respectively. Each first vertical portion VP1 may be disposed between a corresponding first channel pillar CP1 and the first gate stack GST1. The first horizontal portion HP1 may extend between the first gate stack GST1 and the first channel connection portion CC1.

The second memory layer 161B may include a plurality of second vertical portions VP2 and a second horizontal portion HP2 that extends from the plurality of second vertical portions VP2. The plurality of second vertical portions VP2 may surround sidewalls of the plurality of second channel pillars CP2, respectively. Each second vertical portion VP2 may be disposed between a corresponding second channel pillar CP2 and the second gate stack GST2. The second horizontal portion HP2 may extend between the second gate stack GST2 and the second channel connection portion CC2.

The first horizontal portion HP1 of the first memory layer 161A, the first channel connection portion CC1 of the first channel layer 163A, the second horizontal portion HP2 of the second memory layer 161B, and the second channel connection portion CC2 of the second channel layer 163B may surround sidewalls of the plurality of supports 105. A cross-section of each of the support 105, the first vertical portion VP1 of the first memory layer 161A, the second vertical portion VP2 of the second memory layer 161B, the first channel pillar CP1 of the first channel layer 163A, and the second channel pillars CP2 of the second channel layer 163B may be designed in various ways, such as a circular shape, an elliptical shape, or a polygonal shape.

The bit line 179 may be formed of various conductive materials. The bit line 179 may extend along one direction in the XY plane. As an embodiment, the bit line 179 may extend along a third direction DR3, i.e., the X-axis. The bit line 179 may be electrically connected to the corresponding first and second channel pillars CP1 and CP2 through conductive vias 177. Each conductive via 177 may pass through the first insulating layer 170.

The slit insulating layer 173 and the separation insulating layer 175 may extend to pass through the first insulating layer 170. The slit insulating layer 173 and the separation insulating layer 175 may be formed in a line shape, extending in a direction that crosses the bit line 179. As an embodiment, the slit insulating layer 173 and the separation insulating layer 175 may extend in a line shape in a fourth direction DR4, i.e., the Y-axis. The slit insulating layer 173 and the separation insulating layer 175 may extend to have various shapes, such as a zigzag shape, a straight-line shape, or a wave shape.

One or more of the plurality of supports 105 may be disposed between the first channel connection portion CC1 and the second channel connection portion CC2. The one or more of the plurality of supports 105 may be penetrated by the slit insulating layer 173.

Each of the first surface SU11 of the first gate stack GST1 and the first surface SU21 of the second gate stack GST2 may be covered with a gate insulating layer 107. The gate insulating layer 107 may be interposed between the first gate stack GST1 and the first horizontal portion HP1 of the first memory layer 161A and may be interposed between the second gate stack GST2 and the second horizontal portions HP2 of the second memory layer 161B. In another embodiment, the gate insulating layer 107 may be omitted. In this case, the first surface SU11 of the first gate stack GST1 may be in contact with the first horizontal portion HP1 of the first memory layer 161A, and the first surface SU21 of the second gate stack GST2 may be in contact with the second horizontal portion HP2 of the second memory layer 161B.

The doped semiconductor layer 211 may overlap with and may extend to be in contact with the first channel connection portion CC1 of the first channel layer 163A and the second channel connection portion CC2 of the second channel layer 163B. To this end, the doped semiconductor layer 211 may extend in a direction that crosses the plurality of first channel pillars CP1 and the plurality of second channel pillars CP2. As an embodiment, the doped semiconductor layer 211 may extend along the XY plane. A portion of the doped semiconductor layer 211 may be disposed over the slit insulating layer 173.

The doped semiconductor layer 211 may include at least one of an n-type impurity and a p-type impurity. The doped semiconductor layer 211 may include a plurality of impurity areas that are divided according to a concentration and a type of a doped impurity.

The doped semiconductor layer 211 may include a body area. A majority carrier in the body area of the doped semiconductor layer 211 may be selected from an n-type impurity or a p-type impurity according to a method of the erase operation of the semiconductor memory device. As an embodiment, the erase operation of the semiconductor memory device may be performed through a well erase method in which a hole is supplied to the first channel layer 163A and the second channel layer 163B. At this time, the body area of the doped semiconductor layer 211 may include the p-type impurity as the majority carrier. As another embodiment, the erase operation of the semiconductor memory device may be performed by using a gate induced drain leakage (GIDL) erase method in which a hole is supplied by using a GIDL current. At this time, the body area of the doped semiconductor layer 211 may include the n-type impurity as the majority carrier.

The doped semiconductor layer 211 may include a pickup area. The pickup area may include an impurity of the same conductivity type as the majority carrier of the body area at a concentration that is higher than that of the body area.

When the body area of the doped semiconductor layer 211 includes the p-type impurity for the well area as the majority carrier, the doped semiconductor layer 211 may further include a source area. The source area may include an n-type impurity that is opposite to that of the well area as a majority carrier.

The doped semiconductor layer 211 may be covered with a second insulating layer 213. The second insulating layer 213 may be penetrated by a first conductive contact 223 and a plurality of second conductive contacts 225. Each of the first conductive contact 223 and the plurality of second conductive contacts 225 may be formed of a metal layer or may include a metal layer and a metal barrier layer. The metal barrier layer may be disposed between the metal layer and the doped semiconductor layer 211.

The first conductive contact 223 may overlap with the slit insulating layer 173. A spacer insulating layer 221 may be formed on a sidewall of the first conductive contact 223. The plurality of second conductive contacts 225 may overlap with the first gate stack GST1 and the second gate stack GST2.

Positions of the first conductive contact 223 and the second conductive contact 225 may be related to positions of impurity areas in the doped semiconductor layer 211. The positions of the conductive contact and the impurity area, according to various embodiments, are described later with reference to FIGS. 7 to 10.

Figure 6:
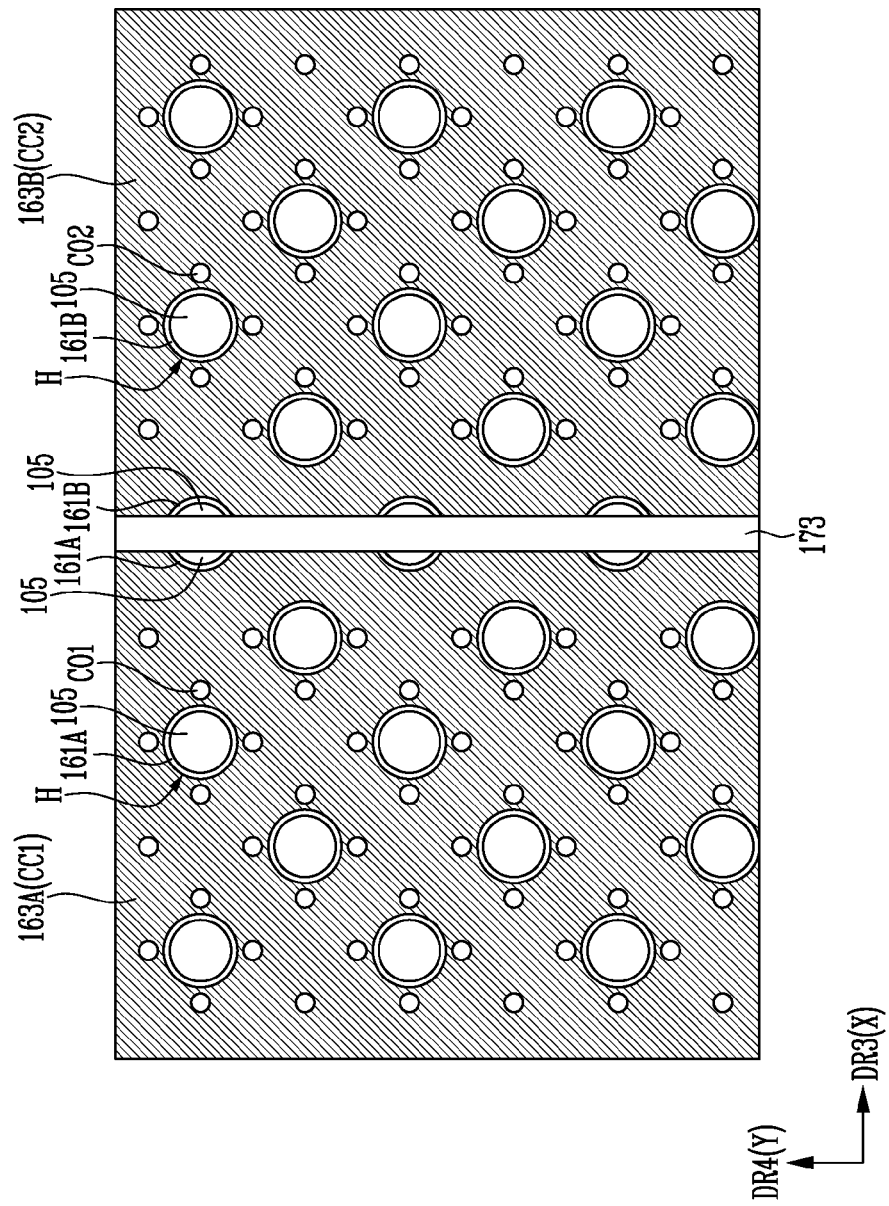
FIG. 6 is a plan view illustrating a first channel connection portion and a second channel connection portion of the semiconductor memory device shown in FIG. 4.

FIG. 6 is a plan view illustrating the first channel connection portion and the second channel connection portion of the semiconductor memory device shown in FIG. 4.

Referring to FIG. 6, the first channel connection portion CC1 of the first channel layer 163A may surround an end of the first core insulating structure CO1 and may extend along the XY plane. The second channel connection portion CC2 of the second channel layer 163B may surround an end of the second core insulating structure CO2 and may extend along the XY plane.

The first channel connection portion CC1 and the second channel connection portion CC2 may be disposed on both sides of the slit insulating layer 173. Each of the first channel connection portion CC1 and the second channel connection portion CC2 may include a plurality of holes H. The plurality of holes H may be arranged to be spaced apart from each other in a direction that crosses the plurality of first channel pillars CP1 and the plurality of second channel pillars CP2, shown in FIG. 4. As an embodiment, the plurality of holes H may be arranged to be spaced apart from each other in the XY plane.

The plurality of supports 105 may be disposed inside of the plurality of holes H. The first memory layer 161A may extend between the first channel connection portion CC1 and the supporter 105 that corresponds to the first channel connection portion CC1. The second memory layer 161B may extend between the second channel connection portion CC2 and the supporter 105 that corresponds to the second channel connection portion CC2. Each of the first memory layer 161A and the second memory layer 161B may extend along a sidewall of the corresponding support 105.

The doped semiconductor layer 211, shown in FIG. 4, may have a contact surface that is in direct contact with the first channel connection portion CC1 and the second channel connection portion CC2, shown in FIG. 6. The first channel connection portion CC1 and the second channel connection portion CC2 may be doped with an impurity that is diffused from the doped semiconductor layer 211.

Figure 7:
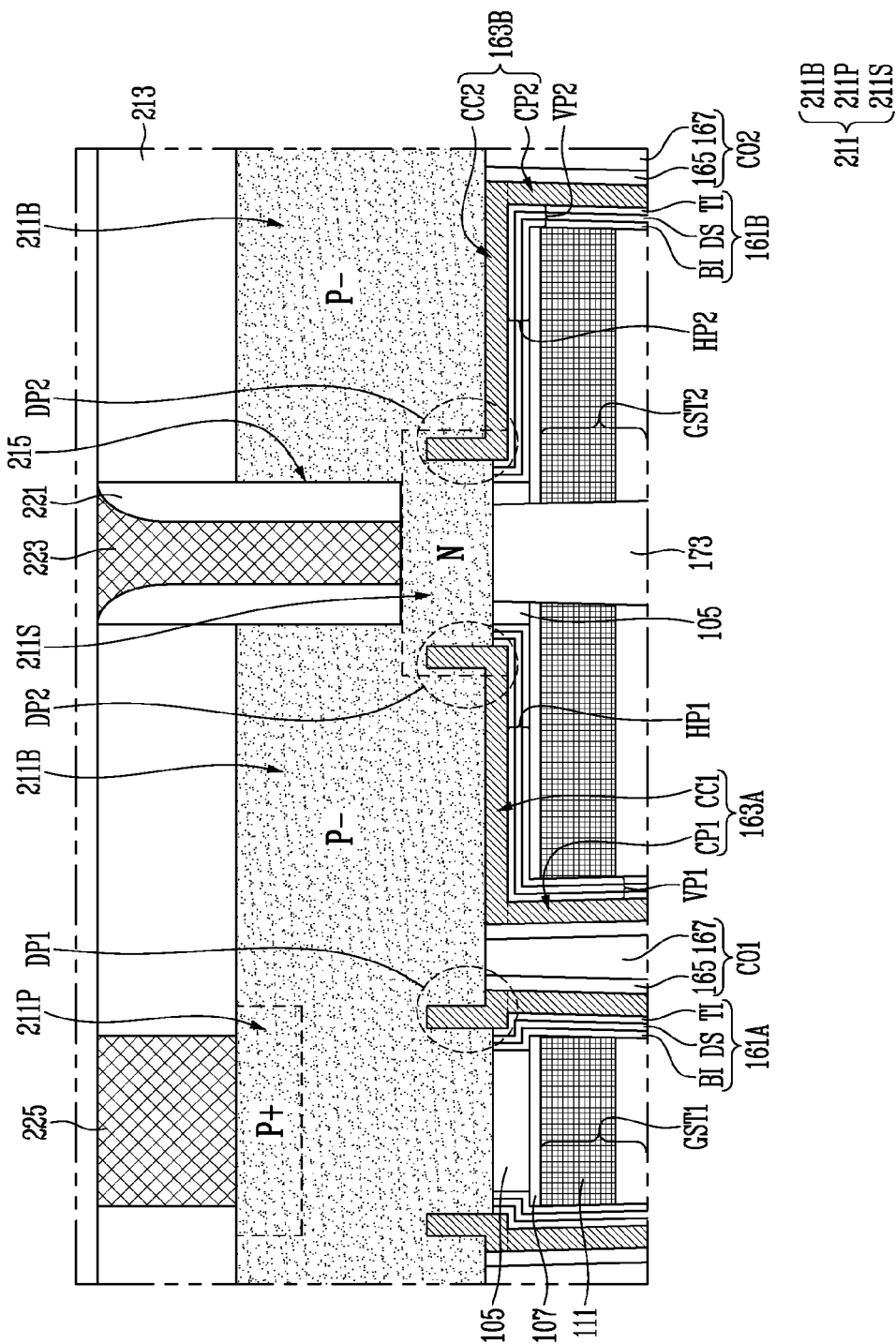
FIG. 7 is an enlarged cross-sectional view of an area A shown in FIG. 4.

FIG. 7 is an enlarged cross-sectional view of an area A shown in FIG. 4.

Referring to FIG. 7, the doped semiconductor layer 211 may include a groove 215 that overlaps with the slit insulating layer 173. The first conductive contact 223 may contact a partial area of the doped semiconductor layer 211, defining a bottom surface of the groove 215, and may be disposed in a central area of the groove 215. The spacer insulating layer 221 may be disposed between the first conductive contact 223 and a sidewall of the groove 215. The spacer insulating layer 221 and the first conductive contact 223 may extend to pass through the second insulating layer 213. The second conductive contact 225 may contact a surface of the doped semiconductor layer 211 on both sides of the slit insulating layer 173.

The doped semiconductor layer 211 may include a body area 211B, a pickup area 211P, and a source area 211S.

The body area 211B may be disposed on both sides of the slit insulating layer 173 to overlap with each of the first channel connection portion CC1 of the first channel layer 163A and the second channel connection portion CC2 of the second channel layer 163B. The body area 211B may include a first impurity P− of a first conductivity type having a first concentration. The first impurity P− may be a majority carrier that is doped in the body area 211B and may be a p-type. The p-type body area 211B may be provided as a well area.

The body area 211B may be in direct contact with each of the first channel connection portion CC1 and the second channel connection portion CC2 so as to be connected to each of the first channel connection portion CC1 and the second channel connection portion CC2. Each of the first channel connection portion CC1 and the second channel connection portion CC2 may include a first doped area DP1 doped with the first impurity P−.

The first channel connection portion CC1 and the second channel connection portion CC2 may protrude into the doped semiconductor layer 211 than the first core insulating structure CO1, the second core insulating structure CO2, the first memory layer 161A, the second memory layer 161B, the support 105, and the slit insulating layer 173.

The pickup area 211P may include a second impurity P+ of the first conductivity type having a second concentration. The second concentration may be higher than the first concentration. The second impurity P+ may be a majority carrier doped in the pickup area 211P and may be a p-type. The p-type pickup area 211P may be provided as a well pickup area.

The pickup area 211P may be formed on a surface of the doped semiconductor layer 211 that overlaps with each of the first gate stack GST1 and the second gate stack GST2. The second conductive contact 225 may be connected to the body area 211B through the pickup area 211P.

The source area 211S may include a third impurity N of a second conductivity type. The third impurity N may be a majority carrier that is doped in the source area 211S and may be an n-type. The source area 211S may be defined between the first channel connection portion CC1 and the second channel connection portion CC2. The source area 211S may overlap with the slit insulating layer 173.

The source area 211S may be in direct contact with an end of the first channel connection portion CC1 and the second channel connection portion CC2 so as to be connected to each of the first channel connection portion CC1 and the second channel connection portion CC2. The third impurity N in the source area 211S may diffuse to the end of each of the first channel connection portion CC1 and the second channel connection portion CC2 that is adjacent to the slit insulating layer 173. Accordingly, each of the first channel connection portion CC1 and the second channel connection portion CC2 may include a second doped area DP2 that is doped with the third impurity N. The first conductive contact 223 may be connected to the first channel connection portion CC1 and the second channel connection portion CC2 through the source area 211S.

Each of the first memory layer 161A and the second memory layer 161B may include a blocking insulating layer BI, a data storage layer DS, and a tunnel insulating layer TI. The blocking insulating layer BI may include an insulating material capable of blocking movement of a charge. The data storage layer DS may include a charge trap layer, a floating gate layer, a conductive nano dot, a phase change layer, and the like. As an embodiment, the data storage layer DS may include a charge trap layer including silicon nitride. The tunnel insulating layer TI may include an insulating material capable of charge tunneling.

At least one of the blocking insulating layer BI, the data storage layer DS, and the tunnel insulating layer TI may form the first horizontal portion HP1 of the first memory layer 161A and the second horizontal portion HP2 of the second memory layer 161B. Through the first horizontal portion HP1 and the second horizontal portion HP2, an insulation characteristic between the conductive pattern 111 for each of the first gate stack GST1 and the second gate stack GST2 and the doped semiconductor layer 211 may be improved.

The conductive pattern 111 that is adjacent to the doped semiconductor layer 211 may be used as a gate of the source select transistor. The gate insulating layer 107 may be formed to be thinner than a thickness of the first memory layer 161A and the second memory layer 161B to secure a turn-on characteristic of the source select transistor. As another embodiment, the gate insulating layer 107 may be omitted.

Figure 8:
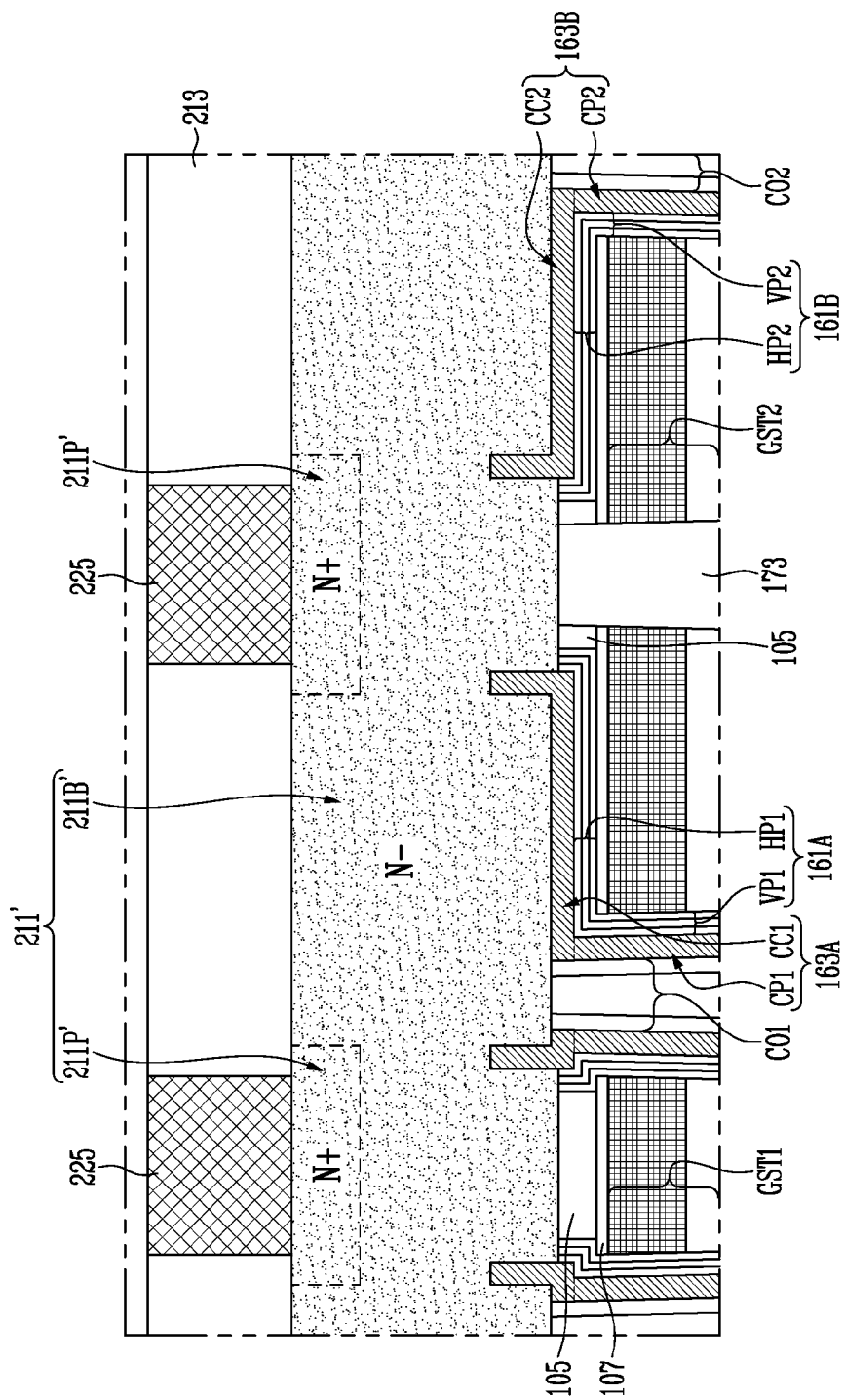
FIGS. 8, 9, and 10 are cross-sectional views illustrating a semiconductor memory device according to various embodiments of the present disclosure.
Figure 9:
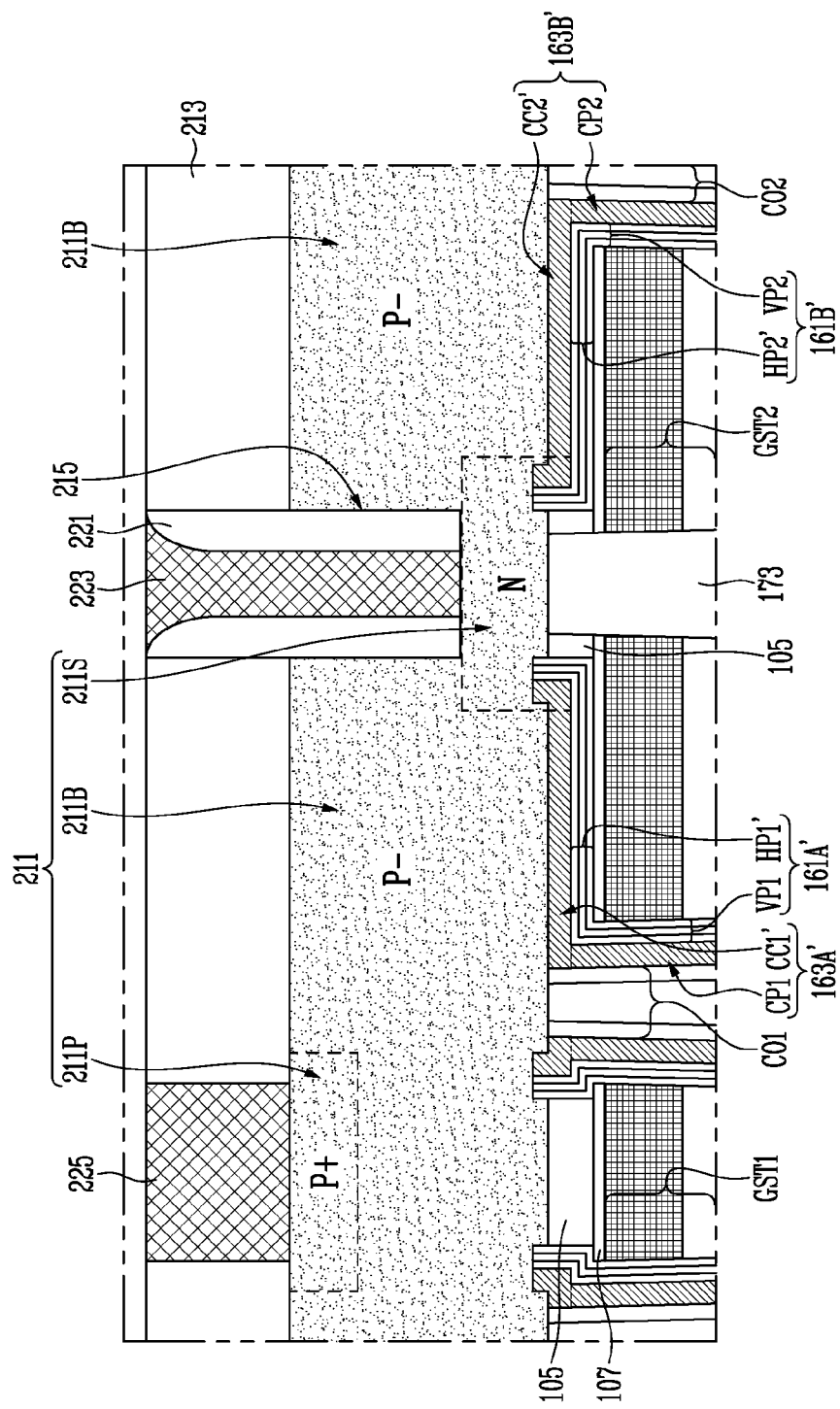
Figure 10:
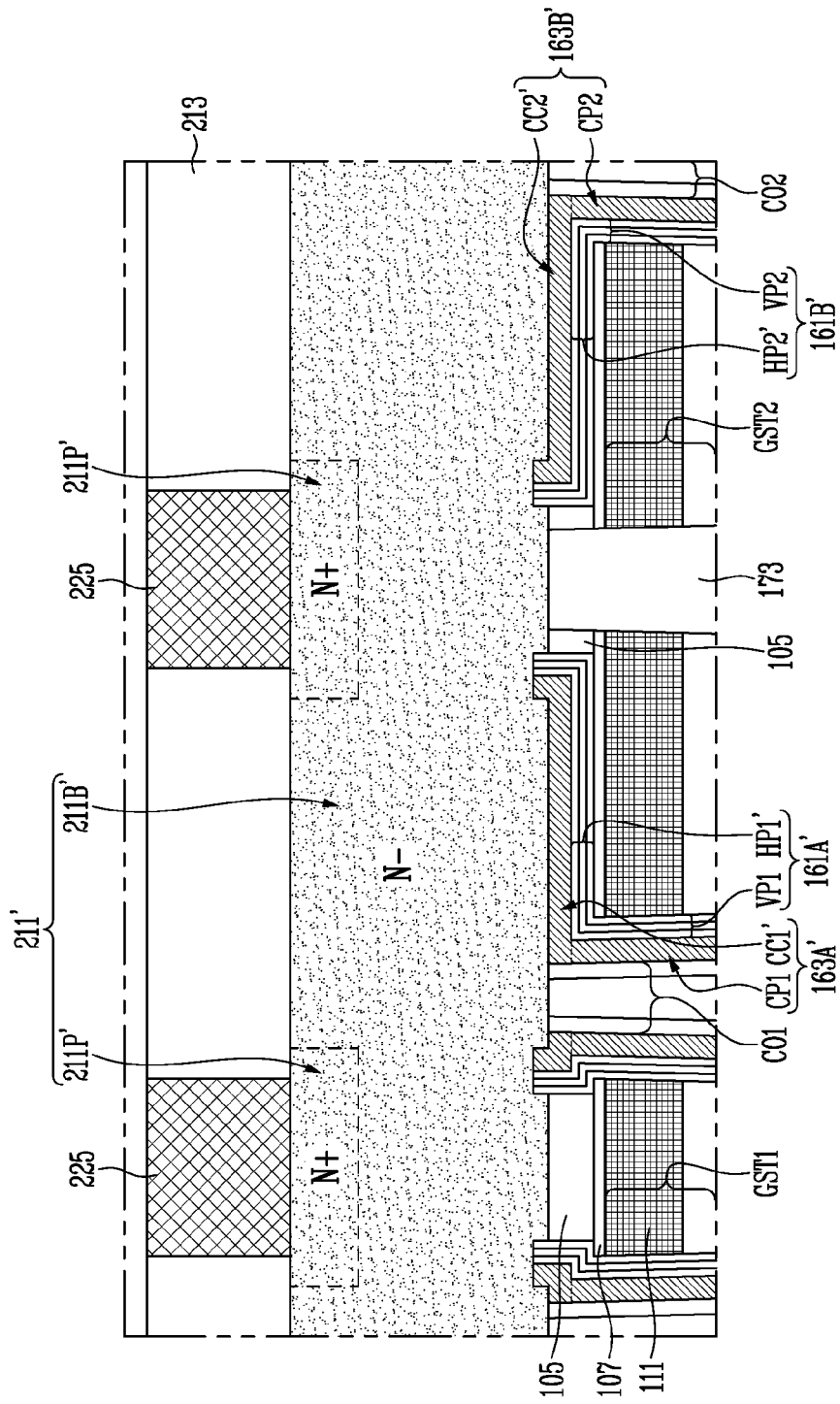

FIGS. 8, 9, and 10 are cross-sectional views illustrating a semiconductor memory device according to various embodiments of the present disclosure. Hereinafter, with respect to the first gate stack GST1, the second gate stack GST2, a first horizontal portion HP1 or HP1' and the first vertical portion VP1 of a first memory layer 161A or 161A', a second horizontal portion HP2 or HP2' and the second vertical portion VP2 of a second memory layer 161B or 1618', the first channel pillar CP1 and a first channel connection portion CC1 or CC1' of a first channel layer 163A or 163A', the second channel pillar CP2 and a second channel connection portion CC2 or CC2' of a second channel layer 163B or 163B', the first core insulating structure CO1, the second core insulating structure CO2, the gate insulating layer 107, the support 105, the slit insulating layer 173, and the second insulating layer 213, shown in FIGS. 8, 9, and 10, description that is repetitive to that of FIGS. 4, 5, 6, and 7 has been omitted.

Referring to FIGS. 8 to 10, the first channel connection portion CC1 or CC1', the second channel connection portion CC2 or CC2', the first horizontal portion HP1 or HP1', and the second horizontal portion HP2 or HP2' may remain in various structures.

Referring to FIG. 8, the first channel connection portion CC1 of the first channel layer 163A and the second channel connection portion CC2 of the second channel layer 163B may protrude into the doped semiconductor layer 211', away from the first gate stack GST1 and the second gate stack GST2, thereby protruding farther than the first horizontal portion HP1 of the first memory layer 161A, the second horizontal portion HP2 of the second memory layer 161B, the first core insulating structure CO1, the second core insulating structure CO2, the support 105, and the slit insulating layer 173.

Referring to FIGS. 9 and 10, the first channel connection portion CC1' of the first channel layer 163A', the second channel connection portion CC2' of the second channel layer 163B' may protrude into the doped semiconductor layer 211 or 211', away from the first gate stack GST1 and the second gate stack GST2, thereby protruding farther than the first horizontal portion HP1' of the first memory layer 161A' and the second horizontal portion HP2' of the second memory layer 161B, the first core insulating structure CO1, the second core insulating structure CO2, the support 105, and the slit insulating layer 173.

Referring to FIGS. 8 to 10, a doped semiconductor layer 211 or 211' may include various impurity areas.

Referring to FIGS. 8 and 10, a surface of the doped semiconductor layer 211' may be substantially flat. The doped semiconductor layer 211' may include a body area 211B' and a plurality of pickup areas 211P'.

The body area 211B' may overlap with the first channel connection portion CC1 or CC1' of the first channel layer 163A and the second channel connection portion CC2 or CC2' of the second channel layer 163B and may also overlap with the slit insulating layer 173.

The body area 211B' may include a source impurity N− for the source area having a first concentration. The source impurity N− may be a majority carrier that is doped in the body area 211B' and may be an n-type. The source impurity N− may diffuse into the first channel connection portion CC1 or CC1' and the second channel connection portion CC2 or CC2'. Accordingly, the first channel connection portion CC1 or CC1' and the second channel connection portion CC2 or CC2' may be doped with the source impurity N−.

Each pickup area 211P' may be provided as a source pickup area and may include a source impurity N+ having a second concentration. The second concentration may be higher than the first concentration. The source impurity N+ may be a majority carrier doped in the pickup area 211P' and may be an n-type. The pickup area 211P' may be formed on a surface of the doped semiconductor layer 211'. A portion of the plurality of pickup areas 211P' may overlap with the slit insulating layer 173.

The plurality of second conductive contacts 225 may be in contact with each of the plurality of pickup areas 211P'.

Referring to FIG. 9, the doped semiconductor layer 211 may include the same body area 211B, source area 211S, and pickup area 211P as described with reference to FIG. 7. The source area 211S and the pickup area 211P may be connected to the first conductive contact 223 and the second conductive contact 225 as described with reference to FIG. 7.

Figure 11A:
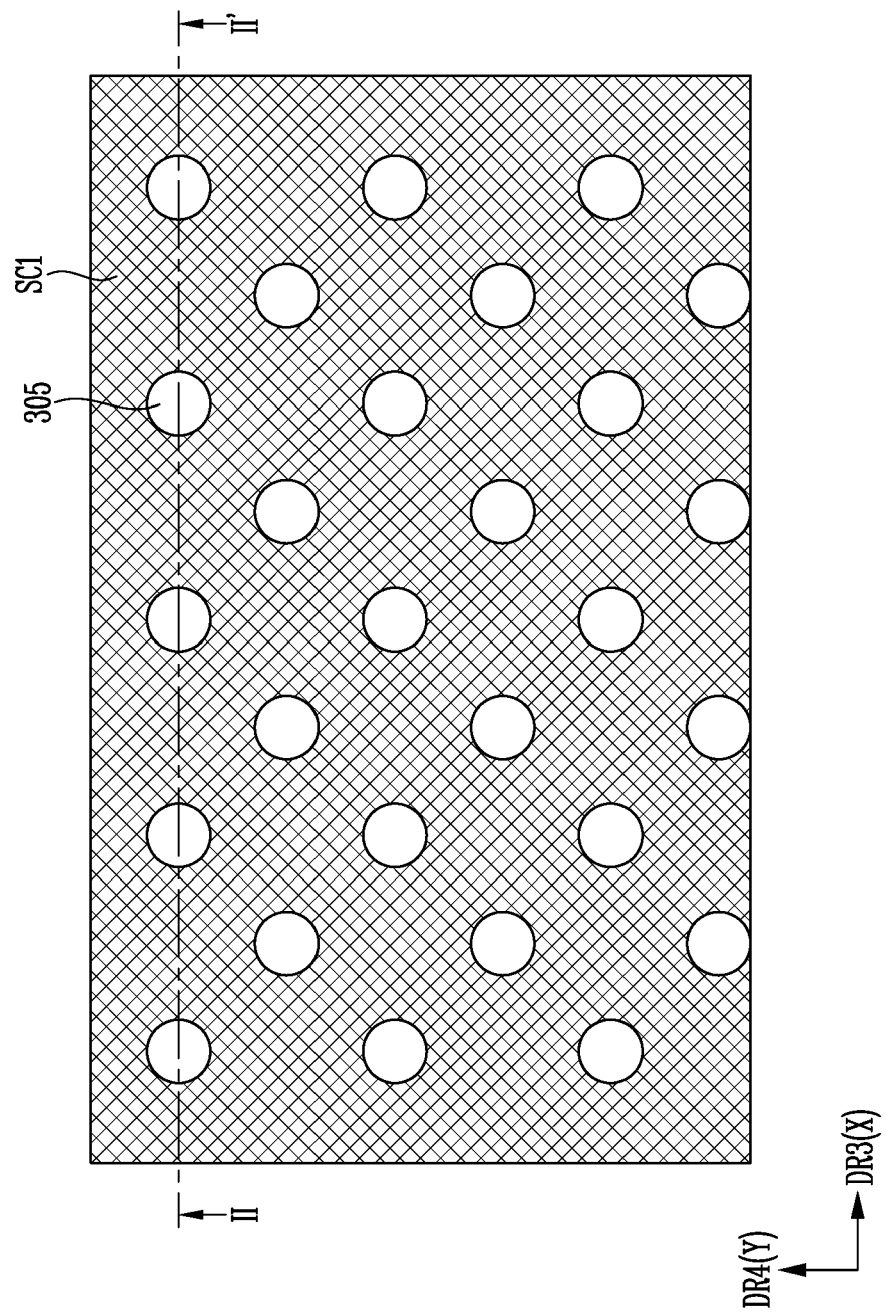
FIGS. 11A and 11B are a plan view and a cross-sectional view illustrating a process of forming a first sacrificial layer and a plurality of supports according to an embodiment of the present disclosure.
Figure 11B:
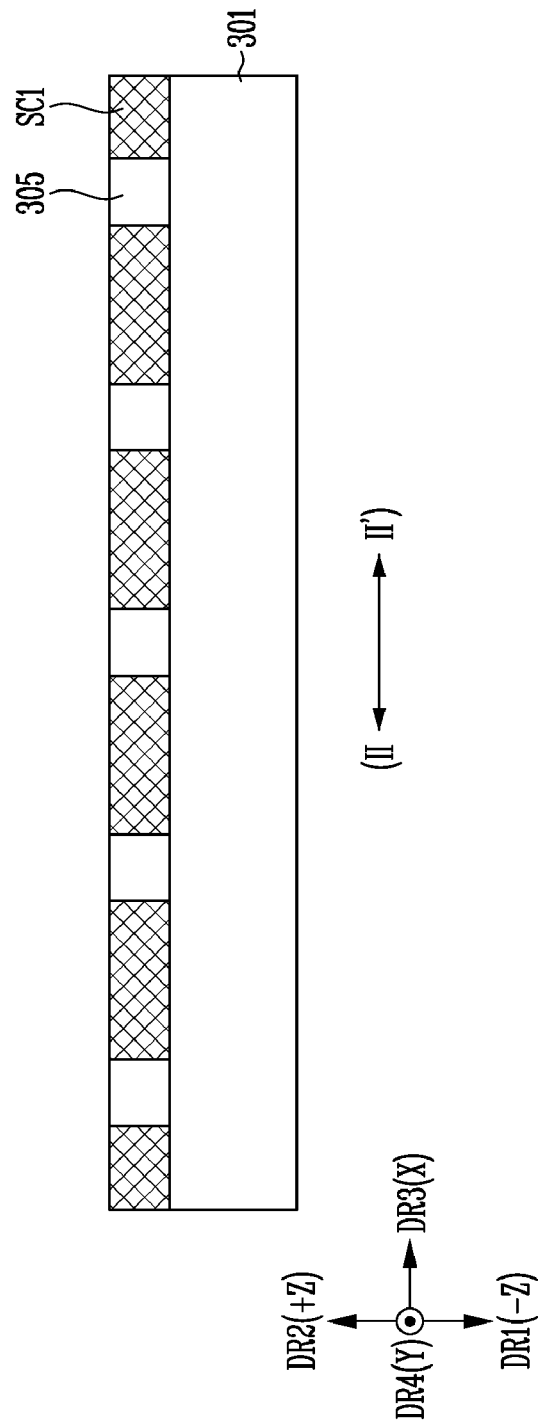

FIGS. 11A and 11B are a plan view and a cross-sectional view illustrating a process of forming a first sacrificial layer and a plurality of supports according to an embodiment of the present disclosure. FIG. 11B is a cross-sectional view taken along a line II-II', shown in FIG. 11A.

Referring to FIGS. 11A and 11B, a plurality of supports 305 may be formed over a lower structure 301. The lower structure 301 may be formed of a silicon layer or may include a silicon layer and an etch protective layer of at least one layer on the silicon layer. The etch protective layer may include a material having an etch selectivity with respect to the silicon layer. As an embodiment, the etch protective layer may include a nitride layer.

The lower structure 301 may include a bottom surface that faces the first direction DR1 (i.e., −Z direction) and an upper surface that faces the second direction DR2 (i.e., +Z direction), the second direction DR2 being opposite to the first direction DR1. The upper surface and the bottom surface of the lower structure 301 may extend along the third direction DR3 (i.e., X direction) and the fourth direction DR4 (i.e., Y direction), the fourth direction DR4 being perpendicular to the third direction DR3. As an embodiment, the upper surface and the bottom surface of the lower structure 301 may extend along the XY plane.

The plurality of supports 305 may be disposed to be spaced apart from each other along the upper surface of the lower structure 301. The plurality of supports 305 may be formed of an insulating material, such as silicon oxide.

Subsequently, a space between the plurality of supports 305 may be filled with a first sacrificial layer SC1. The first sacrificial layer SC1 may extend along the XY plane to surround the plurality of supports 305. The first sacrificial layer SC1 may include a material having an etch selectivity with respect to the plurality of supports 305. As an embodiment, the first sacrificial layer SC1 may include at least one of a metal layer and a metal nitride layer. The metal layer may include tungsten, and the metal nitride layer may include titanium nitride.

FIGS. 12A, 12B, 12C, 12D, and 12E are cross-sectional views illustrating a process of forming a memory cell array and a process of forming a bit line according to an embodiment of the present disclosure.

Figure 12A:
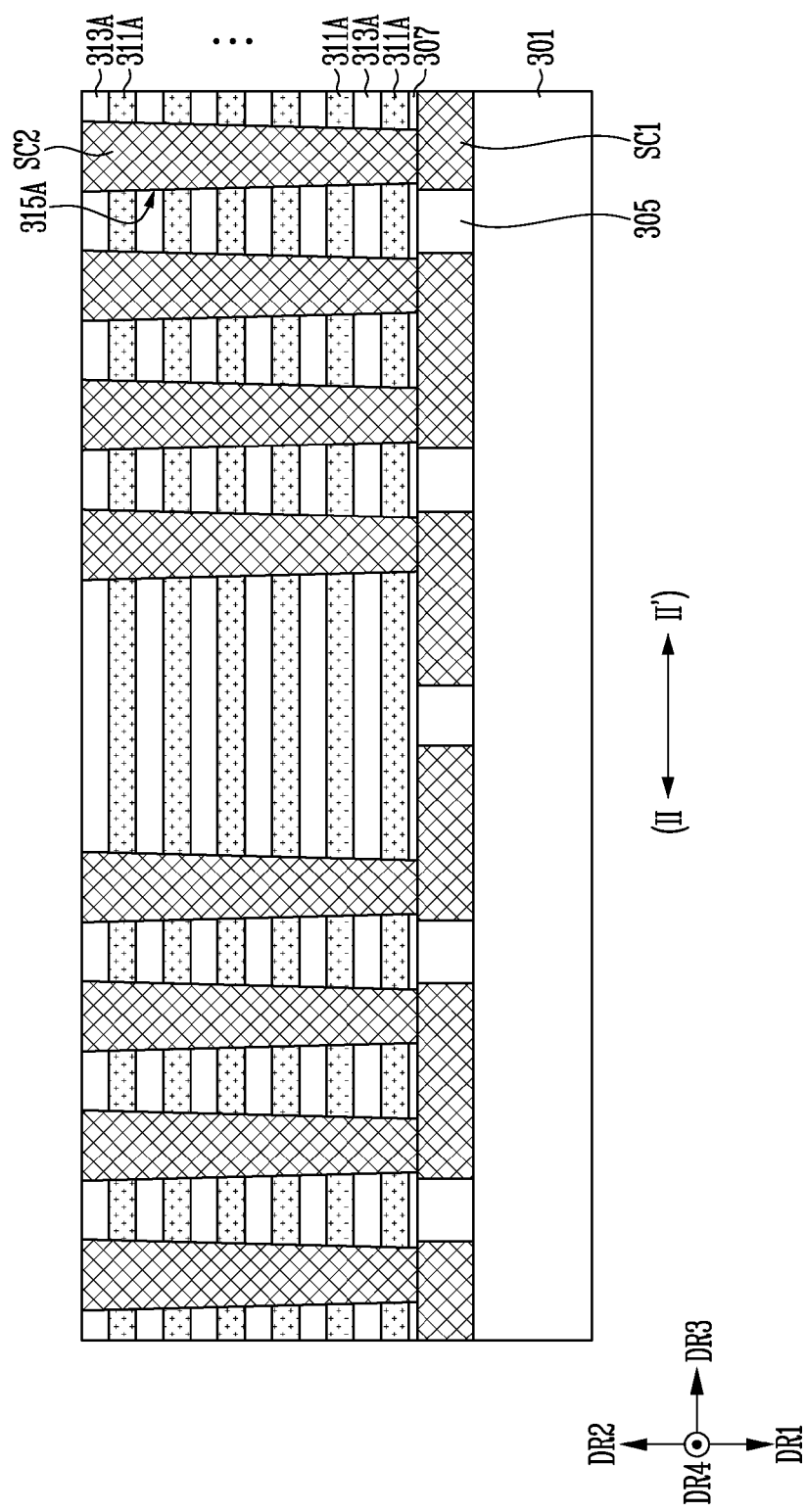
FIGS. 12A, 12B, 12C, 12D, and 12E are cross-sectional views illustrating a process of forming a memory cell array and a process of forming a bit line according to an embodiment of the present disclosure.

Referring to FIG. 12A, a gate insulating layer 307 may be formed over the plurality of supports 305 and the first sacrificial layer SC1, provided through the process that is described with reference to FIGS. 11A and 11B. The gate insulating layer 307 may include an insulating material, such as silicon oxide.

Subsequently, a plurality of lower first material layers 311A and a plurality of lower second material layers 313A may be alternately stacked on the gate insulating layer 307. The plurality of lower first material layers 311A may be formed of a material that is different from that of the plurality of lower second material layers 313A. As an embodiment, the plurality of lower first material layers 311A may include a conductive layer that includes at least one of a doped semiconductor layer, a metal layer, and a conductive metal nitride layer, and the plurality of lower second material layers 313A may include an insulating layer, such as silicon oxide. As another embodiment, the plurality of lower first material layers 311A may include a sacrificial material having an etch selectivity with respect to the plurality of lower second material layers 313A. As an embodiment, the sacrificial material of the plurality of lower first material layers 311A may include silicon nitride, and the plurality of lower second material layers 313A may include silicon oxide.

Although not shown in the drawing, a process of forming the gate insulating layer 307 may be omitted. In this case, a stack structure of the plurality of lower first material layers 311A and the plurality of lower second material layers 313A may be directly formed on the plurality of supports 305 and the first sacrificial layer SC1.

Thereafter, a plurality of lower channel holes 315A may be formed by etching the plurality of lower first material layers 311A, the plurality of lower second material layers 313A, and the gate insulating layer 307. The plurality of lower channel holes 315A may pass through the plurality of lower first material layers 311A, the plurality of lower second material layers 313A, and the gate insulating layer 307 that overlap with the first sacrificial layer SC1. Accordingly, the first sacrificial layer SC1 may be exposed through the plurality of lower channel holes 315A.

Subsequently, a second sacrificial layer SC2 may be formed to fill the plurality of lower channel holes 315A. The second sacrificial layer SC2 may include a material having an etch selectivity in the plurality of lower first material layers 311A, the plurality of lower second material layers 313A, and the gate insulating layer 307. As an embodiment, the second sacrificial layer SC2 may include at least one of a metal layer and a metal nitride layer. The metal layer may include tungsten, and the metal nitride layer may include titanium nitride.

Figure 12B:
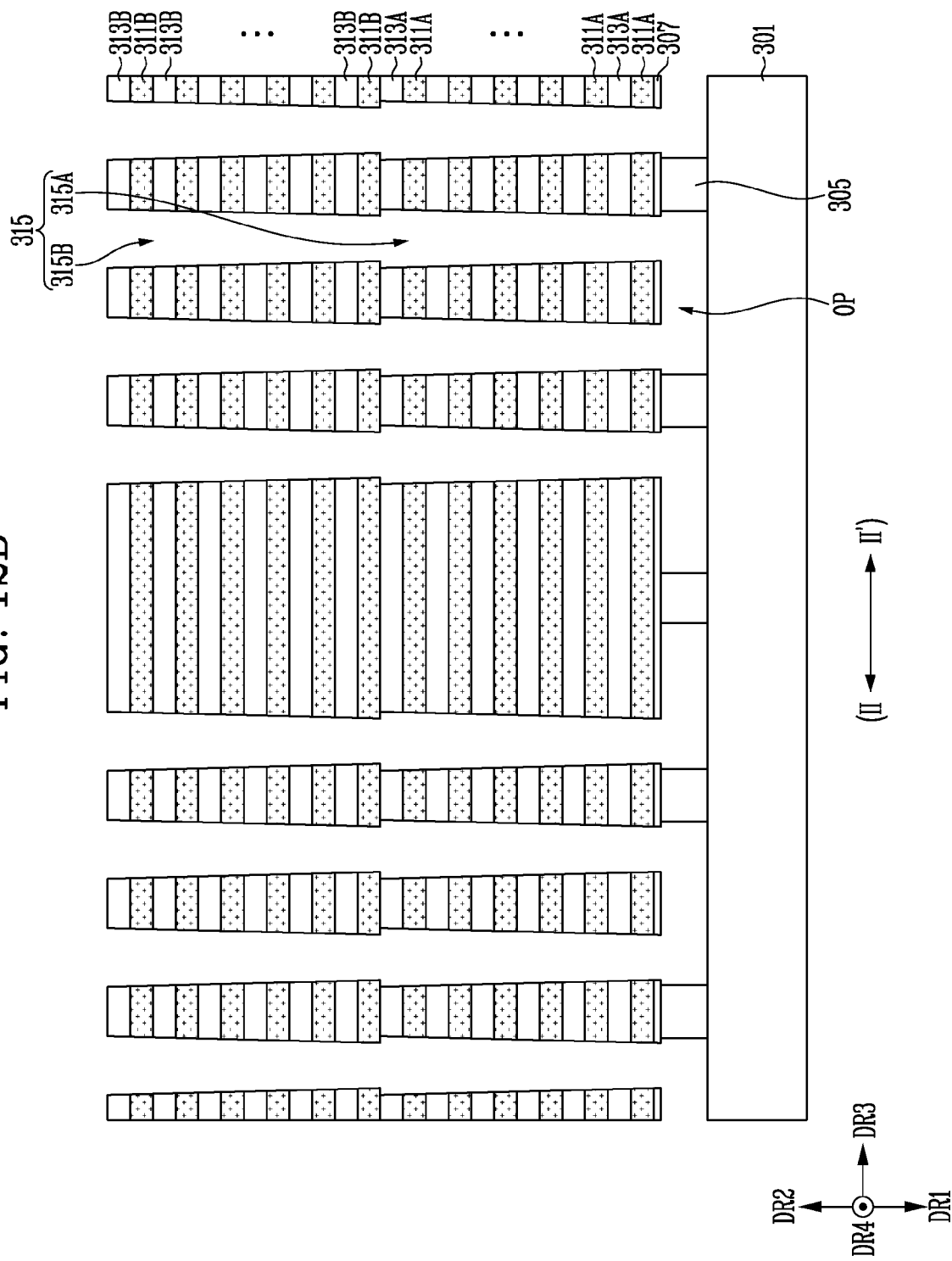

Referring to FIG. 12B, a plurality of upper first material layers 311B and a plurality of upper second material layers 313B may be alternately stacked on the plurality of lower first material layers 311A and the plurality of lower second material layers 313A. The plurality of upper first material layers 311B may be formed of the same material as the plurality of lower first material layers 311A. The plurality of upper second material layers 313B may be formed of the same material as the plurality of lower second material layers 313A.

Subsequently, a plurality of upper channel holes 315B may be formed by etching the plurality of upper first material layers 311B and the plurality of upper second material layers 313B. The plurality of upper channel holes 315B may be connected to the plurality of lower channel holes 315A and may expose the second sacrificial layer SC2, shown in FIG. 12A. Thereafter, the first sacrificial layer SC1 and the second sacrificial layer SC2, shown in FIG. 12A, may be removed through the plurality of upper channel holes 315B. Accordingly, the plurality of channel holes 315 may be opened. Each channel hole 315 may be defined by connecting an upper channel hole 315B to a corresponding lower channel hole 315A. As the first sacrificial layer SC1 shown in FIG. 12A is removed, an opening OP may be formed between a stack of the plurality of lower first material layers 311A and the plurality of lower second material layers 313A and the lower structure 301. The plurality of channel holes 315 may be connected to each other through the opening OP.

A process of forming the plurality of channel holes 315 is not limited to the description with reference to FIGS. 12A and 12B. In another embodiment, a process of forming the plurality of lower channel holes 315A and the second sacrificial layer SC2 may be omitted. In this case, a plurality of channel holes may be formed by etching the plurality of upper first material layers 311B, the plurality of upper second material layers 313B, the plurality of lower first material layers 311A, and the plurality of lower second material layers 313A at once, and the first sacrificial layer SC1, shown in FIG. 12A, may be exposed.

Figure 12C:
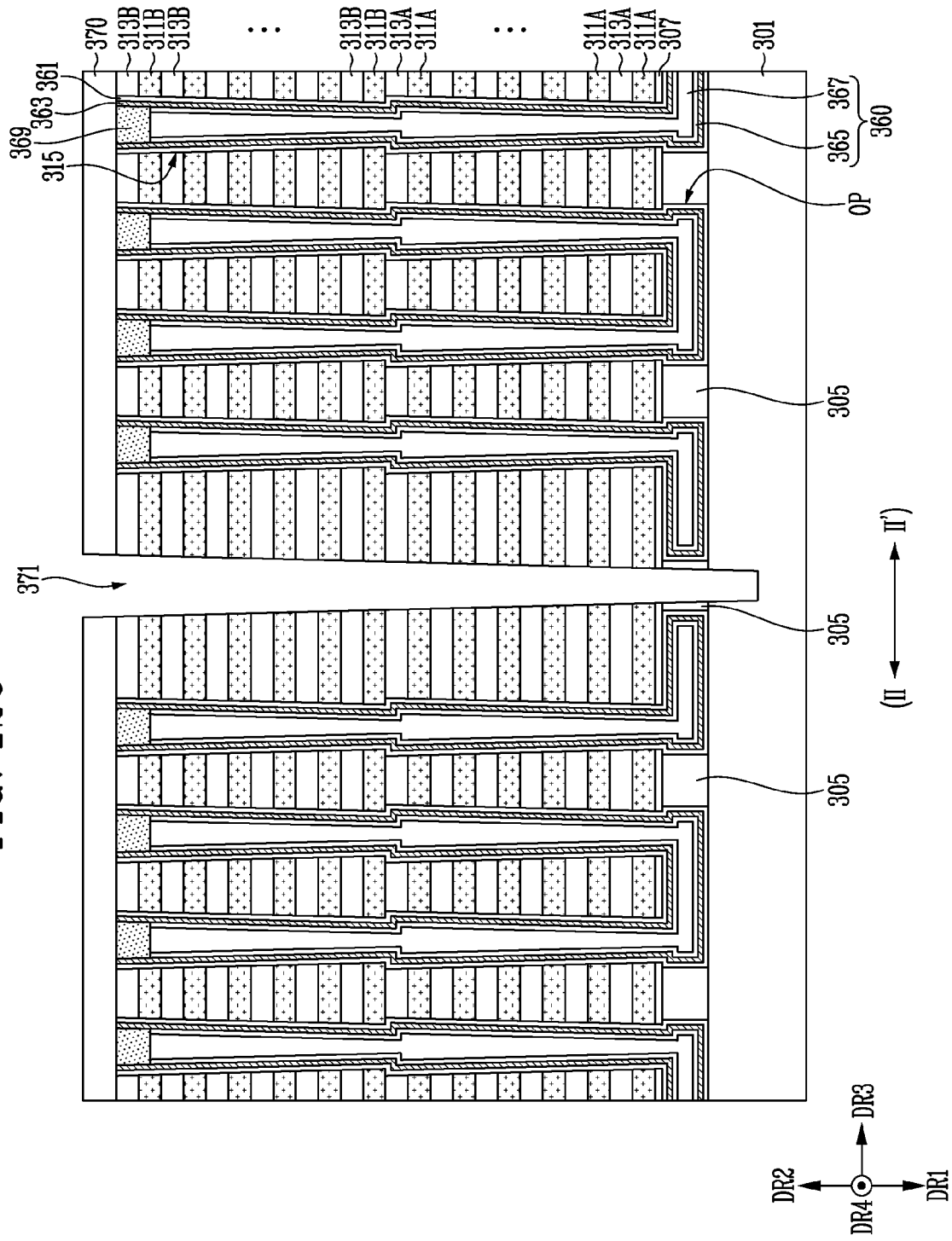

Referring to FIG. 12C, a memory layer 361 may be formed along a surface of the plurality of channel holes 315 and the opening OP. As described with reference to FIG. 7, the memory layer 361 may include a blocking insulating layer, a data storage layer, and a tunnel insulating layer. The memory layer 361 may extend to surround a sidewall of the support 305.

Subsequently, a channel layer 363 may be formed on a surface of the memory layer 361. The channel layer 363 may be formed of a semiconductor material, such as silicon or germanium. The channel layer 363 may extend to surround the sidewall of the support 305 with the memory layer 361 that is interposed therebetween.

Thereafter, a core insulating structure 360 may be formed in the plurality of channel holes 315 and the opening OP. The core insulating structure 360 may include at least one insulating layer. As an embodiment, the core insulating structure 360 may include a buffer layer 365 and a gap fill layer 367. The buffer layer 365 may be formed on the channel layer 363. The gap fill layer 367 may fill a central area of the channel hole 315 and a central area of the opening OP. Although the step is not explicitly shown in the drawing, a lower portion of the channel hole 315 may be filled with the buffer layer 365 before the central area of the opening OP is filled with the gap fill layer 367. In other words, after forming the buffer layer 365, a hollow may be formed in the central area of the opening OP that is surrounded by the buffer layer 365, and the hollow may be filled with the gap fill layer 367.

Subsequently, a capping pattern 369 may be formed in the channel hole 315. The capping pattern 369 may be disposed over the core insulating structure 360. The capping pattern 369 may include a doped semiconductor layer that includes at least one of an n-type impurity and a p-type impurity. As an embodiment, the capping pattern 369 may include an n-type doped silicon layer.

Thereafter, a first insulating layer 370 may be formed over a stack of the plurality of upper first material layers 311B and the plurality of upper second material layers 313B. The memory layer 361, the channel layer 363, the core insulating structure 360, and the capping pattern 369 may be covered with the first insulating layer 370.

Subsequently, a slit 371 may be formed to pass through the first insulating layer 370, the plurality of lower first material layers 311A, the plurality of lower second material layers 313A, the plurality of upper first material layers 311B, and the plurality of upper second material layers 313B. In a plan view, the slit 371 may extend in a line shape similarly to the slit SI of FIG. 5. The slit 371 may extend into the lower structure 301 by passing through the gate insulating layer 307 and the support 105.

As an embodiment, the plurality of lower first material layers 311A and the plurality of upper first material layers 311B may be formed as conductive layers, and the plurality of lower second material layers 313A and the plurality of upper second material layers 313B may be formed as insulating layers. In this case, a gate stack may be defined by the plurality of lower first material layers 311A, the plurality of upper first material layers 311B, the plurality of lower second material layers 313A, and the plurality of upper second material layers 313B that are partitioned by the slit 371.

As another embodiment, the plurality of lower first material layers 311A and the plurality of upper first material layers 311B may be formed of silicon nitride, and the plurality of lower second material layers 313A and the plurality of upper second material layers 313B may be formed of silicon oxide. In this case, in order to form the gate stack, a process of replacing the plurality of lower first material layers 311A and the plurality of upper first material layers 311B with a plurality of conductive patterns 321A and 321B may be performed as shown in FIG. 12D.

Figure 12D:
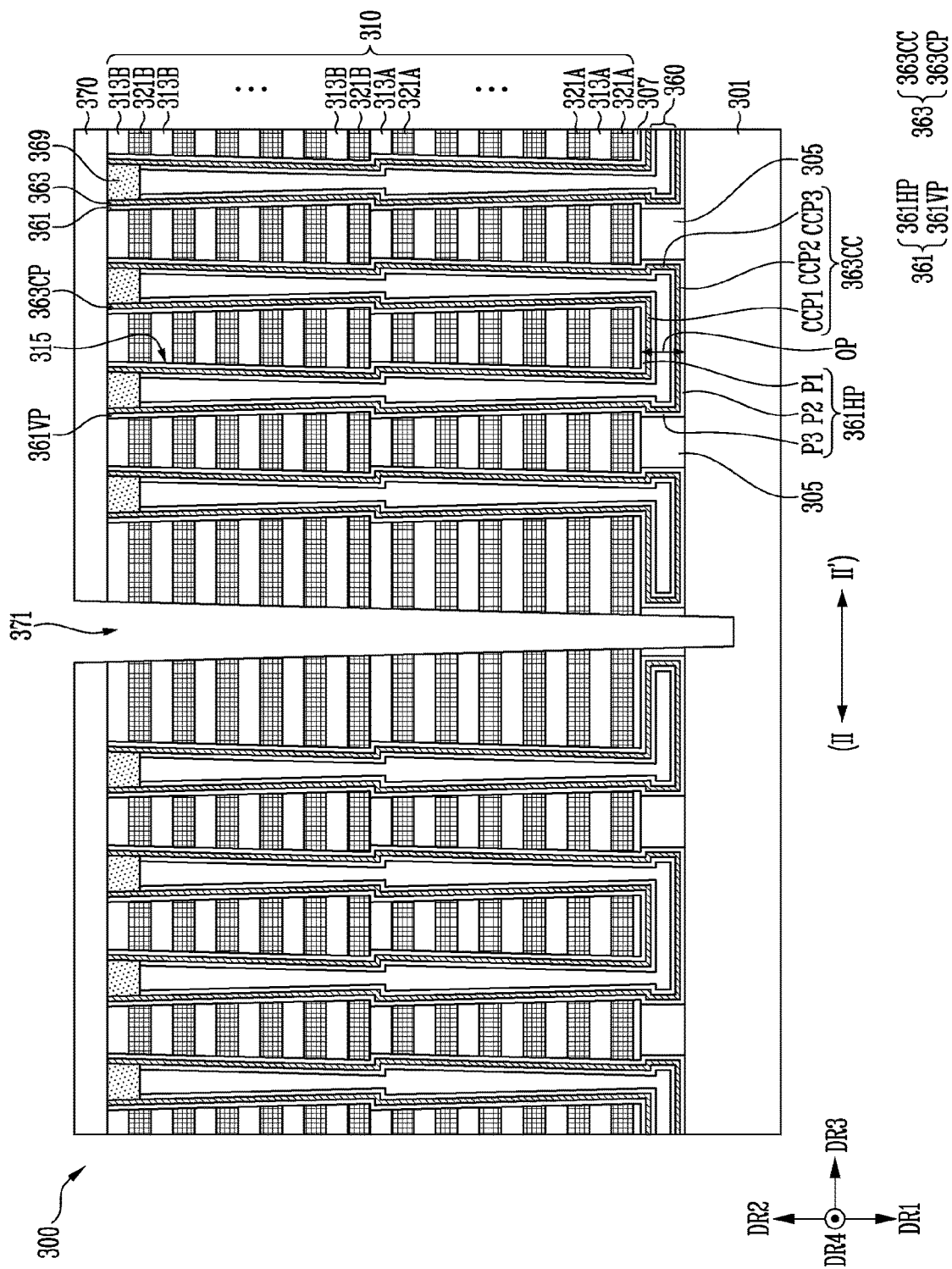

Referring to FIG. 12D, the plurality of lower first material layers 311A and the plurality of upper first material layers 311B, shown in FIG. 12C, may be replaced with the plurality of conductive patterns 321A and 321B through the slit 371. The plurality of conductive patterns 321A and 321B may include a plurality of first conductive patterns 321A and a plurality of second conductive patterns 321B. The plurality of first conductive patterns 321A may be alternately disposed with the plurality of lower second material layers 313A, and the plurality of second conductive patterns 321B may be alternately disposed with the plurality of upper second material layers 313B. The plurality of lower second material layers 313A and the plurality of upper second material layers 313B may be used as the plurality of interlayer insulating layers 113, described with reference to FIG. 4.

As described above, a gate stack 310 may be formed through various methods.

A memory cell array 300 may be provided through the processes that are described with reference to FIGS. 12A to 12D. The memory cell array 300 may include the gate stack 310, the memory layer 361, the channel layer 363, the core insulating structure 360, and the capping pattern 369. The gate stack 310 may be disposed over the plurality of supports 305 and may include a plurality of channel holes 315. The plurality of channel holes 315 may be connected to each other through the opening OP that is defined between the gate stack 310 and the lower structure 301.

The memory layer 361 may include a plurality of vertical portions 361VP and a horizontal portion 361HP. The horizontal portion 361HP may extend along a surface of the opening OP. The horizontal portion 361HP may include a first portion P1, a second portion P2, and a third portion P3. The first portion P1 may be adjacent to the gate stack 310. The second portion P2 may be spaced apart from the first portion P1 and may be adjacent to the lower structure 301. The third portion P3 may connect the first portion P1 and the second portion P2 and may surround a sidewall of each support 305. The plurality of vertical portions 361VP may extend from the horizontal portion 361HP along a sidewall of the plurality of channel holes 315.

The channel layer 363 may include a plurality of channel pillars 363CP and a channel connection portion 363CC. The channel connection portion 363CC may extend along a surface of the horizontal portion 361HP. The channel connection portion 363CC may include a first connection portion CCP1, a second connection portion CCP2, and a third connection portion CCP3. The first connection portion CCP1 may be adjacent to the gate stack 310. The second connection portion CCP2 may be spaced apart from the first connection portion CCP1 and may be adjacent to the lower structure 301. The third connection portion CCP3 may connect the first connection portion CCP1 and the second connection portion CCP2 and may surround the sidewall of each support 305. The plurality of channel pillars 363CP may extend from the channel connection portion 363CC along a surface of the plurality of vertical portions 361VP.

Figure 12E:
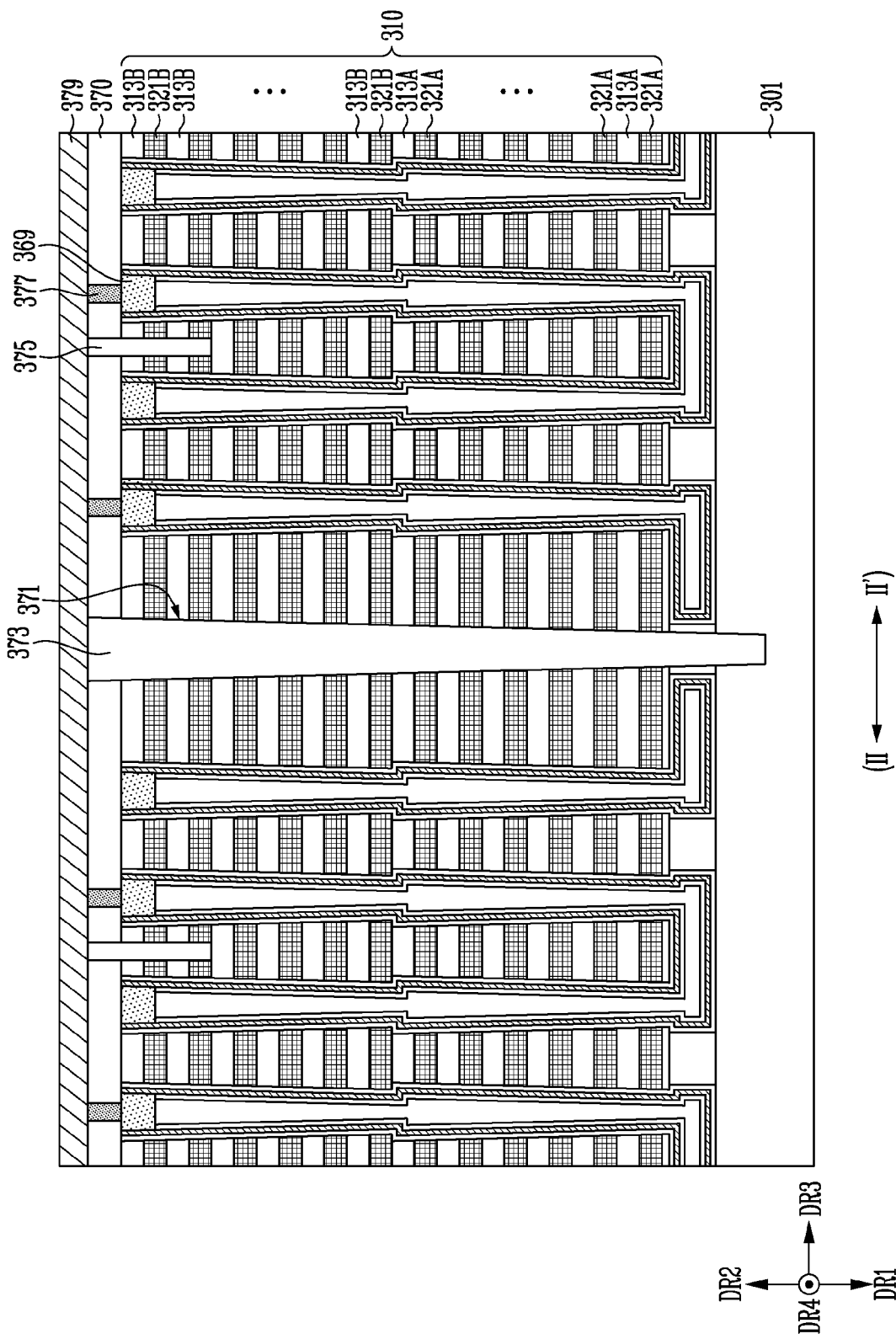

Referring to FIG. 12E, a slit insulating layer 373 may be formed inside of the slit 371. Thereafter, a separation insulating layer 375 that passes through the first insulating layer 370 may be formed. The separation insulating layer 375 may extend into the gate stack 310. The second conductive pattern 3218 of at least one layer that is adjacent to the first insulating layer 370 may be separated into the drain select lines, as shown in FIG. 3, by the separation insulating layer 375.

Subsequently, a plurality of conductive vias 377 that pass through the first insulating layer 370 may be formed. Each conductive via 377 may be connected to the corresponding capping pattern 369.

Thereafter, a bit line 379 may be formed over the first insulating layer 370. The bit line 379 may be connected to the corresponding capping pattern 369 through the conductive via 377.

Figure 13:
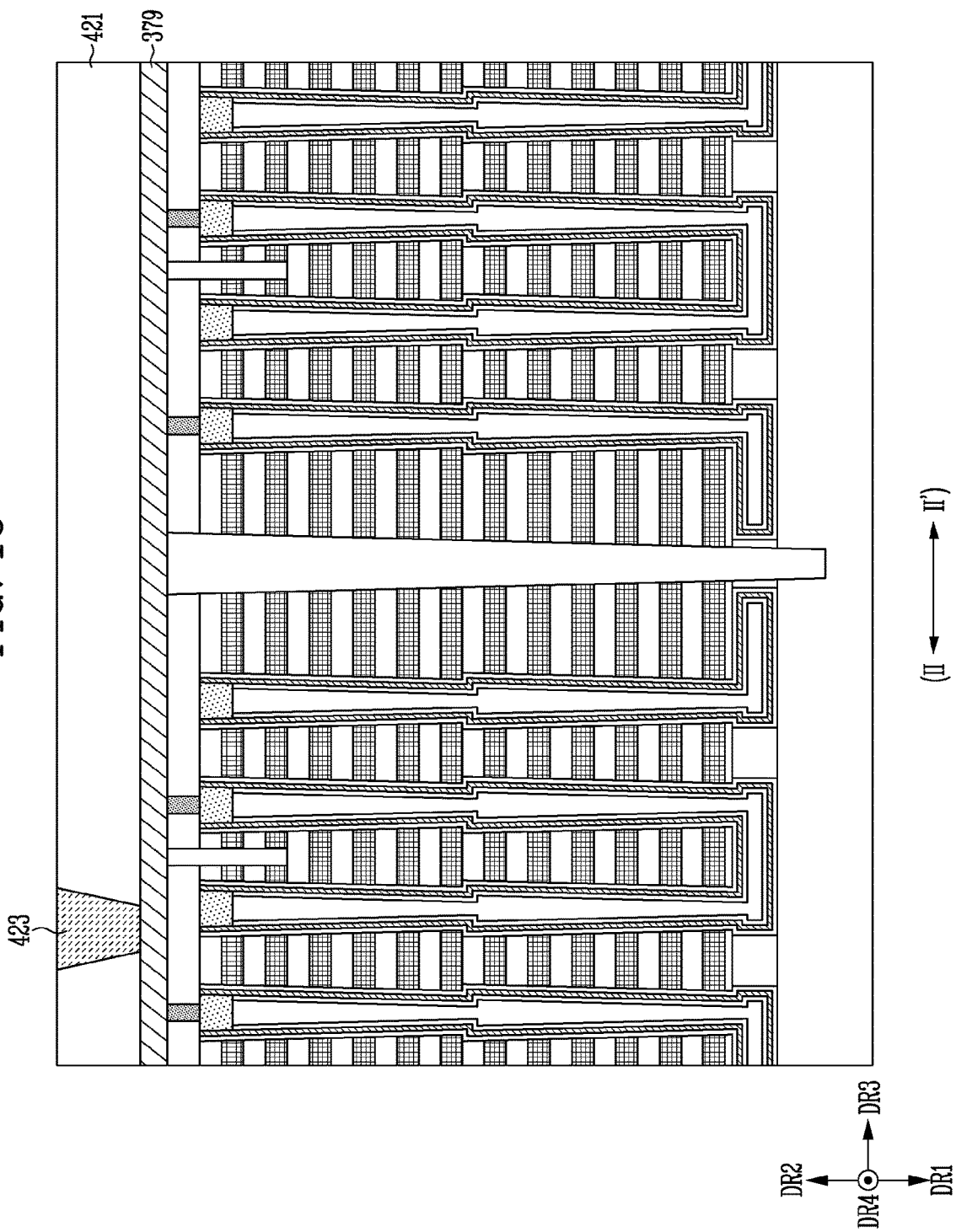
FIG. 13 is a cross-sectional view illustrating a process of forming a cell array side bonding structure according to an embodiment of the present disclosure.

FIG. 13 is a cross-sectional view illustrating a process of forming a cell array side bonding structure according to an embodiment of the present disclosure.

Referring to FIG. 13, the cell array side bonding structure may include a first bonding insulating layer 421 and a first conductive bonding pad 423. The first bonding insulating layer 421 may be formed over the bit line 379, provided through the process that is described with reference to FIG. 12E. The first bonding insulating layer 421 may include silicon oxide, silicon oxynitride, silicon carbonitride, or the like. Thereafter, the first conductive bonding pad 423 that passes through the first bonding insulating layer 421 may be formed. The first conductive bonding pad 423 may include a metal, such as copper or a copper alloy.

Figure 14:
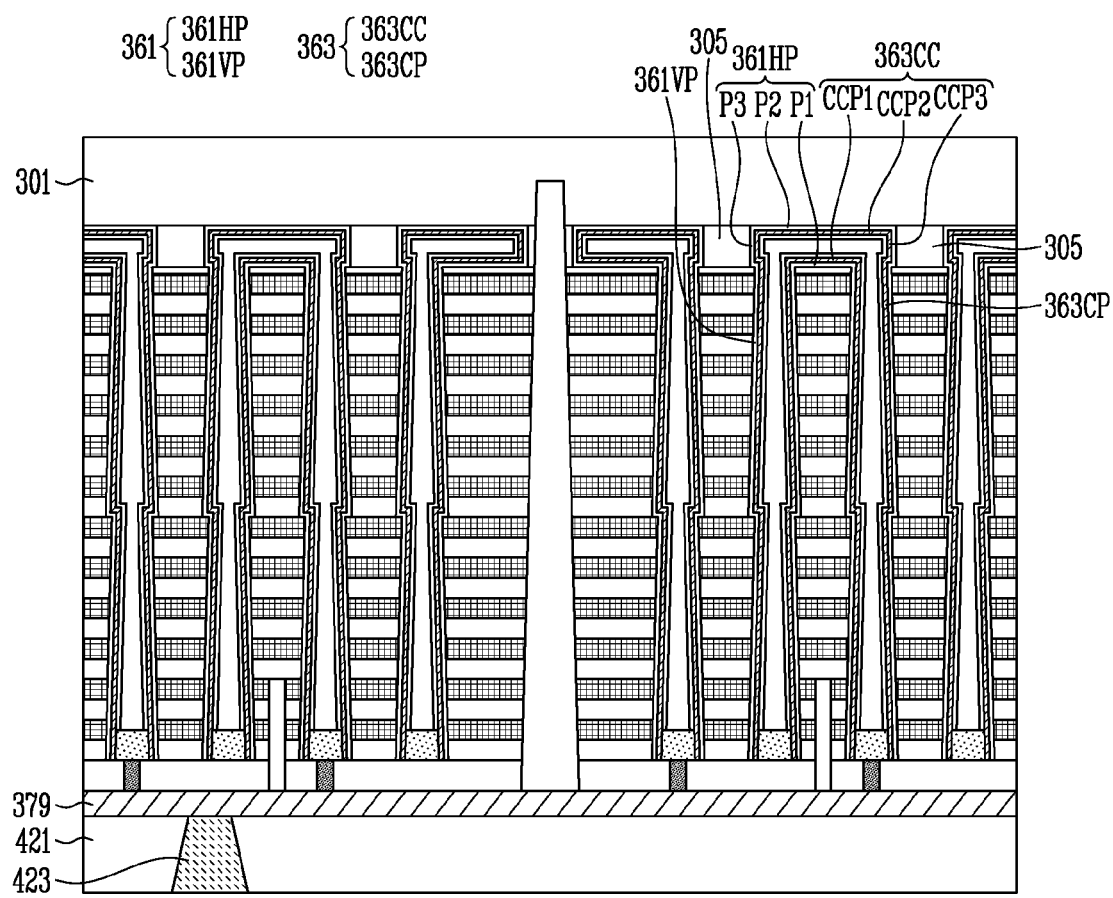
FIG. 14 is a cross-sectional view illustrating a bonding process according to an embodiment of the present disclosure.
Figure 14:
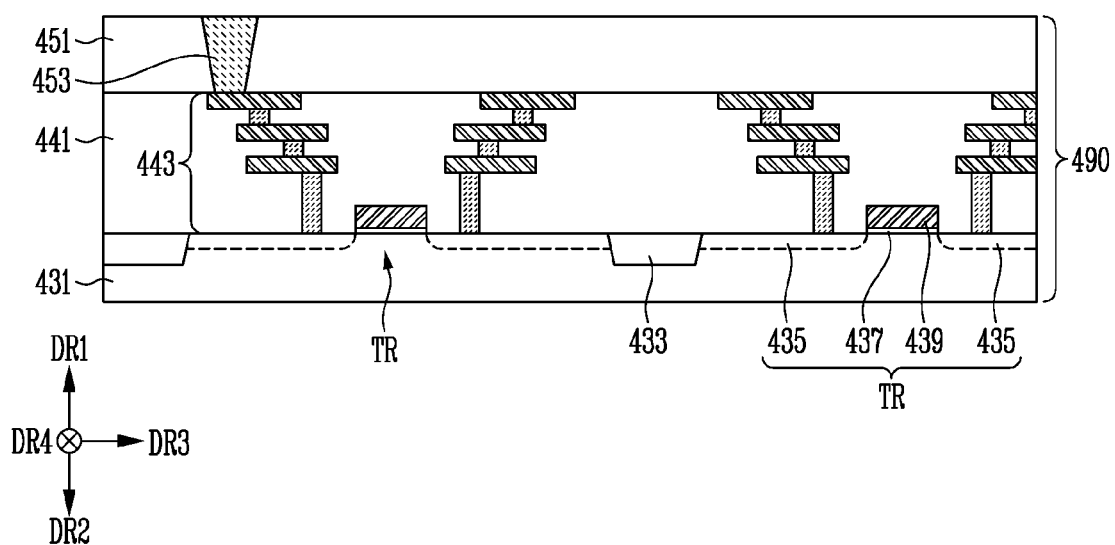

FIG. 14 is a cross-sectional view illustrating a bonding process according to an embodiment of the present disclosure.

Referring to FIG. 14, a peripheral circuit structure 490 may be provided through a separate process. The peripheral circuit structure 490 may include a plurality of transistors TR, a plurality of interconnections 443, and a second conductive bonding pad 453.

Each transistor TR may be disposed in an active area of the semiconductor substrate 431. The semiconductor substrate 431 may be a silicon substrate, a silicon-germanium substrate, a germanium substrate, a single crystal silicon substrate, or a substrate including a single crystal epitaxial layer. The active area of the semiconductor substrate 431 may be partitioned by an element separation layer 433.

Each transistor TR may include a gate insulating layer 437, a gate electrode 439, and junctions 435. The gate insulating layer 437 and the gate electrode 439 may be stacked on the active area of the semiconductor substrate 431. The junctions 435 may be formed in the active area of the semiconductor substrate 431 on both sides of the gate electrode 439 and may be defined as areas into which at least one of an n-type impurity and a p-type impurity is implanted. The junctions 435 may be provided as a source area and a drain area of the corresponding transistor TR.

The plurality of transistors TR may be connected to the plurality of interconnections 443. Each interconnection 443 may include two or more sub-conductive patterns.

The semiconductor substrate 431 and the plurality of transistors TR may be covered with a lower insulating structure 441. The plurality of interconnections 443 may be buried in the lower insulating structure 441. The lower insulating structure 441 may include two or more insulating layers.

A second bonding insulating layer 451 may be disposed over the lower insulating structure 441. The second conductive bonding pad 453 may pass through the second bonding insulating layer 451 to be connected to a corresponding interconnection 443. The second bonding insulating layer 451 may include silicon oxide, silicon oxynitride, silicon carbonitride, or the like. The second conductive bonding pad 453 may include a metal, such as copper or a copper alloy.

The first conductive bonding pad 423, provided through the process that is described above with reference to FIG. 13, may be aligned to face the second conductive bonding pad 453. Thereafter, the first conductive bonding pad 423 may be bonded to the second conductive bonding pad 453, and the first bonding insulating layer 421 may be bonded to the second bonding insulating layer 451.

FIGS. 15A, 15B, 15C, and 15D are cross-sectional views illustrating a process of exposing a channel connection portion according to an embodiment of the present disclosure.

Figure 15A:
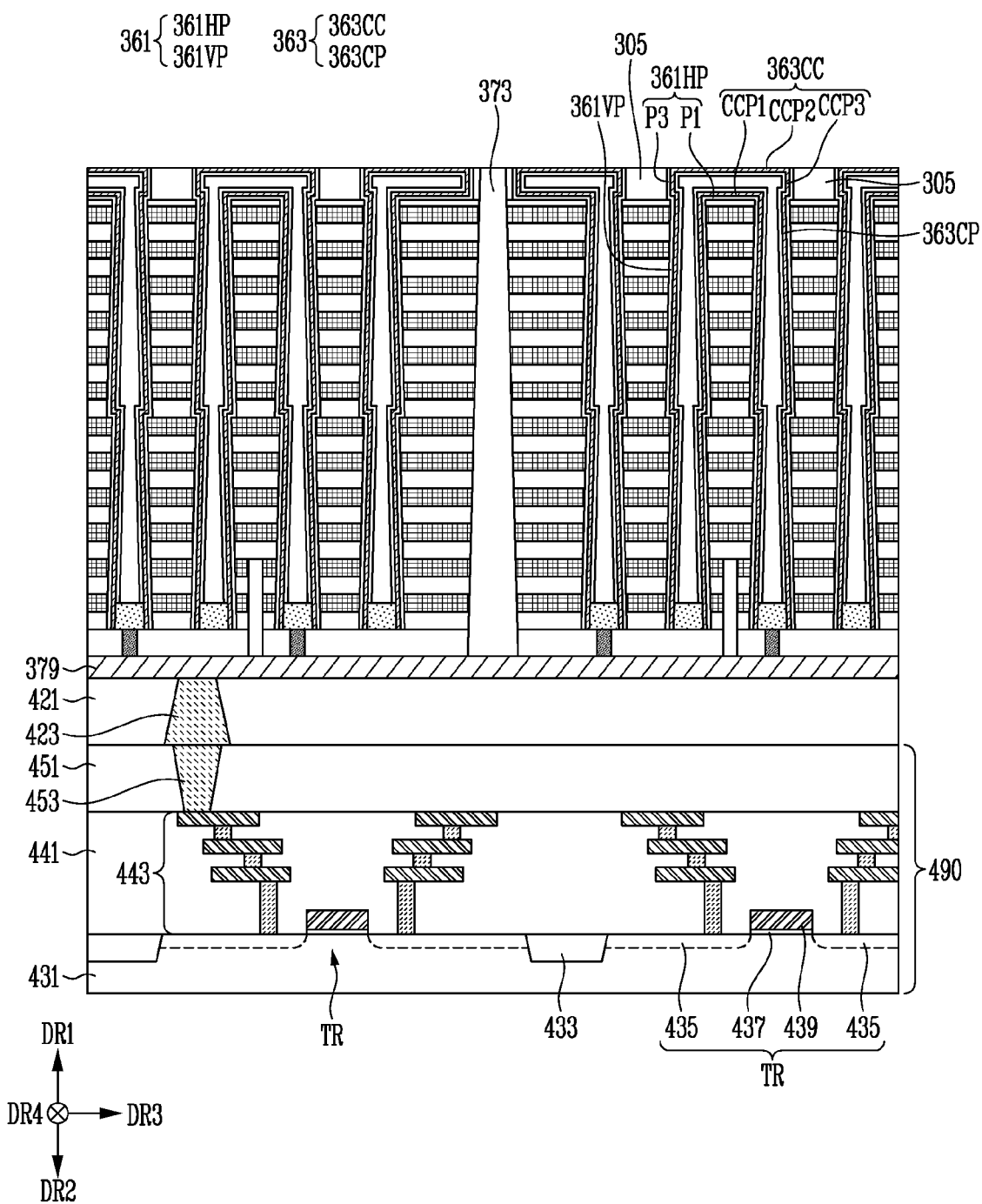
FIGS. 15A, 15B, 15C, and 15D are cross-sectional views illustrating a process of exposing a channel connection portion according to an embodiment of the present disclosure.

Referring to FIG. 15A, the memory cell array may be electrically connected to the peripheral circuit structure 490 through the bonding process, described with reference to FIG. 14. As an embodiment, the channel layer 363 of the memory cell array may be electrically connected to the transistor TR of the peripheral circuit structure 490 through the second conductive bonding pad 453.

After the bonding process, the lower structure 301 shown in FIG. 14 may be removed. Accordingly, the horizontal portion 361HP of the memory layer 361, shown in FIG. 14, may be exposed. The lower structure 301 may be removed through grinding and chemical mechanical polishing (CMP).

Subsequently, the second portion P2 of the horizontal portion 361HP shown in FIG. 14 may be removed to expose the second connection portion CCP2 of the channel connection portion 363CC. The second portion P2 of the horizontal portion 361HP may be removed through CMP, wet etching, or the like.

While removing the lower structure 301 and the second portion P2 of the horizontal portion 361HP, shown in FIG. 14, a portion of the slit insulating layer 373 and a portion of the support 305 may be removed.

Figure 15B:
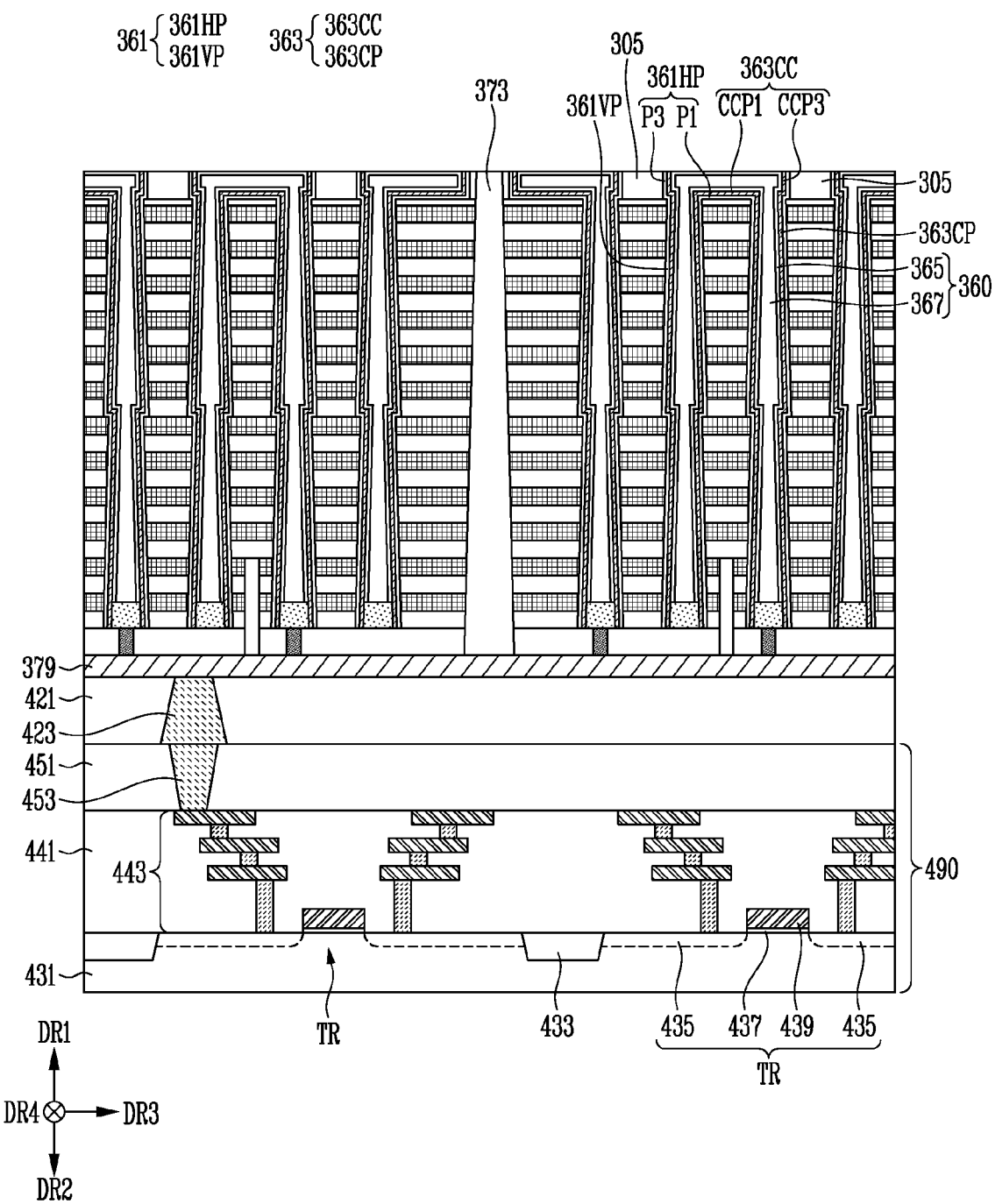

Referring to FIG. 15B, the second connection portion CCP2 of the channel connection portion 363CC, shown in FIG. 15A, may be removed. Accordingly, the core insulating structure 360 may be exposed. The second connection portion CCP2 may be removed through CMP.

Figure 15C:
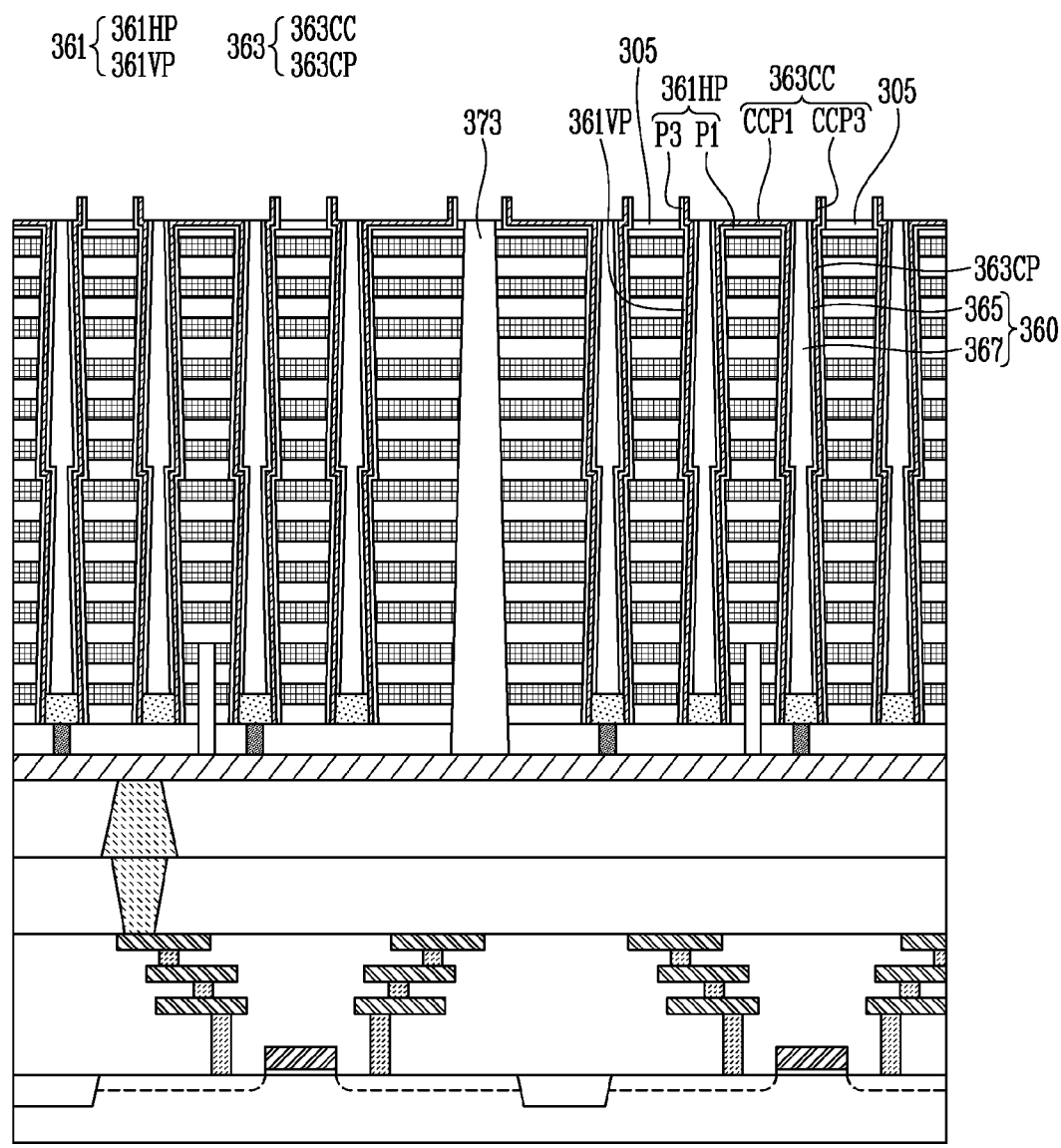

Referring to FIG. 15C, a portion of the core insulating structure 360 may be removed so that the first connection portion CCP1 of the channel connection portion 363CC may be exposed. The memory layer 361 may include a material having an etch selectivity with respect to the core insulating structure 360. Accordingly, the horizontal portion 361HP of the memory layer 361 may remain. While removing a portion of the core insulating structure 360, a portion of the slit insulating layer 373 and a portion of the support 305 may be removed.

Figure 15D:
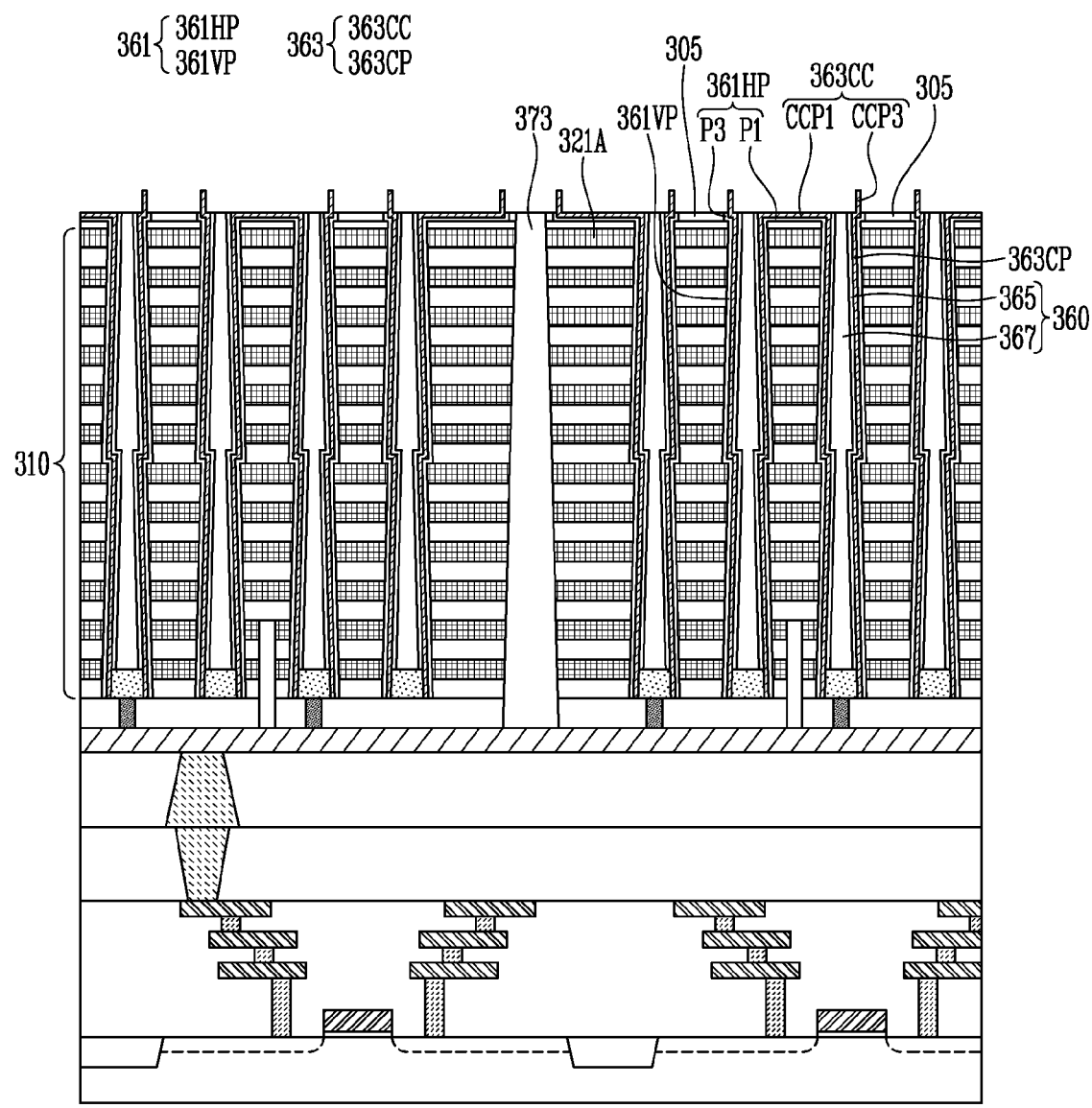

Referring to FIG. 15D, a portion of the third portion P3 may be removed so that an outer wall of the third connection portion CCP3 may be exposed. At this time, a portion of the slit insulating layer 373 and a portion of the support 305 may be removed.

Through the processes, described with reference to FIGS. 15A to 15D, the first connection portion CCP1 of the channel connection portion 363CC may be exposed. An inner sidewall and an outer sidewall of the third connection portion CCP3 may also be exposed. As described above, while performing the processes for exposing the channel connection portion 363CC, the first portion P1 of the horizontal portion 361HP may be protected by the first connection portion CCP1 of the channel connection portion 363CC and may remain. Accordingly, while performing the processes that expose the channel connection portion 363CC, a phenomenon in which the vertical portion 361VP of the memory layer 361 is lost may be avoided. When the vertical portion 361VP of the memory layer 361 is lost, the first conductive pattern 321A of the gate stack 310 that is adjacent to the channel connection portion 363CC may be exposed. In this case, a current leakage may occur through an area in which the vertical portion 361VP is lost. Because an embodiment of the present disclosure may improve to avoid the loss of the vertical portion 361VP, thereby decreasing the current leakage, operation reliability of the semiconductor memory device may be improved.

FIGS. 16A, 16B, 16C, 16D, and 16E are cross-sectional views illustrating a subsequent process according to an embodiment performed after the process shown in FIG. 15D.

Figure 16A:
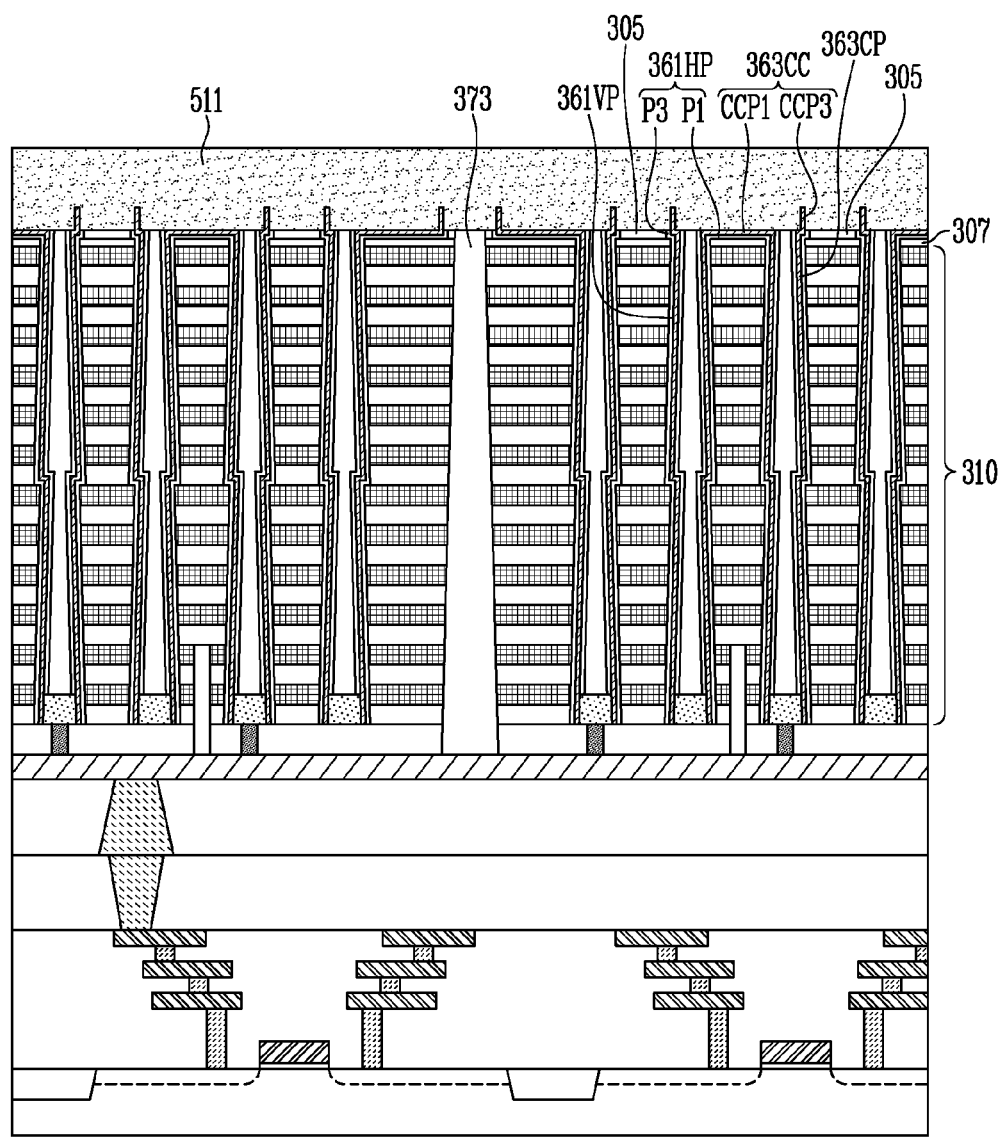
FIGS. 16A, 16B, 16C, 16D, and 16E are cross-sectional views illustrating a subsequent process according to an embodiment performed after a process shown in FIG. 15D.
Figure 16A:
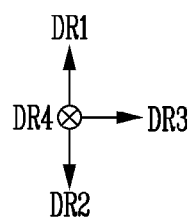

Referring to FIG. 16A, a doped semiconductor layer 511 may be formed over the exposed channel connection portion 363CC through the process that is described with reference to FIG. 15D. The doped semiconductor layer 511 may include a surface that is in contact with the first connection portion CCP1 and the third connection portion CCP3 of the channel connection portion 363CC. The doped semiconductor layer 511 may extend to overlap with the gate stack 310 and the slit insulating layer 373.

The doped semiconductor layer 511 may include at least one of an n-type impurity and a p-type impurity. The doped semiconductor layer 511 may include a first impurity of a first conductivity type as a majority carrier. As an embodiment, the first impurity may be a p-type impurity for providing a well area. For example, the doped semiconductor layer 511 may be formed of a p-type doped silicon layer. The doped semiconductor layer 511 may include the first impurity having a first concentration.

Figure 16B:
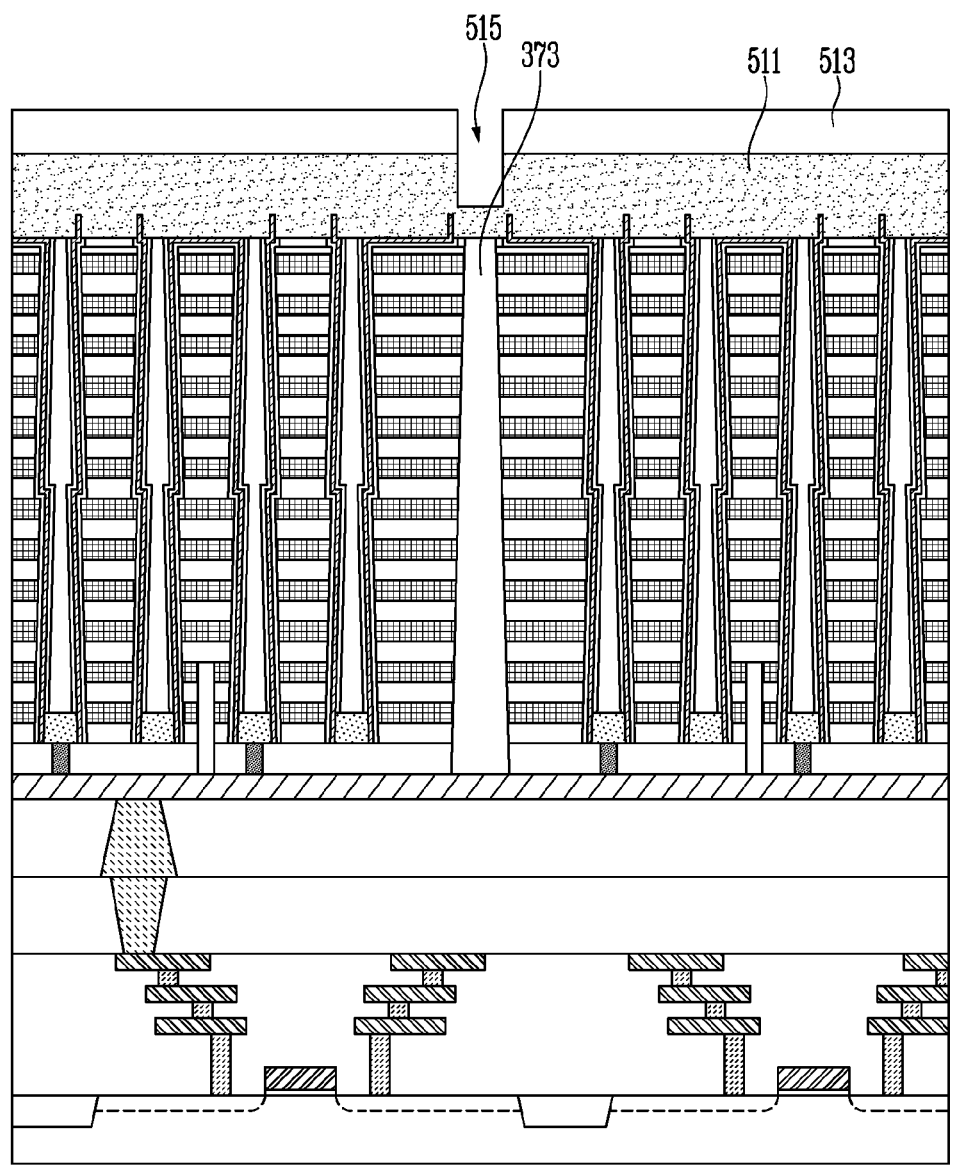

Referring to FIG. 16B, a second insulating layer 513 may be formed over the doped semiconductor layer 511. Subsequently, a portion of the second insulating layer 513 and the doped semiconductor layer 511 may be etched. Accordingly, a groove 515 may be formed in the doped semiconductor layer 511. The groove 515 may pass through the second insulating layer 513, and a bottom surface of the groove 515 may be defined by a remaining doped semiconductor layer 511. The groove 515 may overlap with the slit insulating layer 373.

Figure 16C:
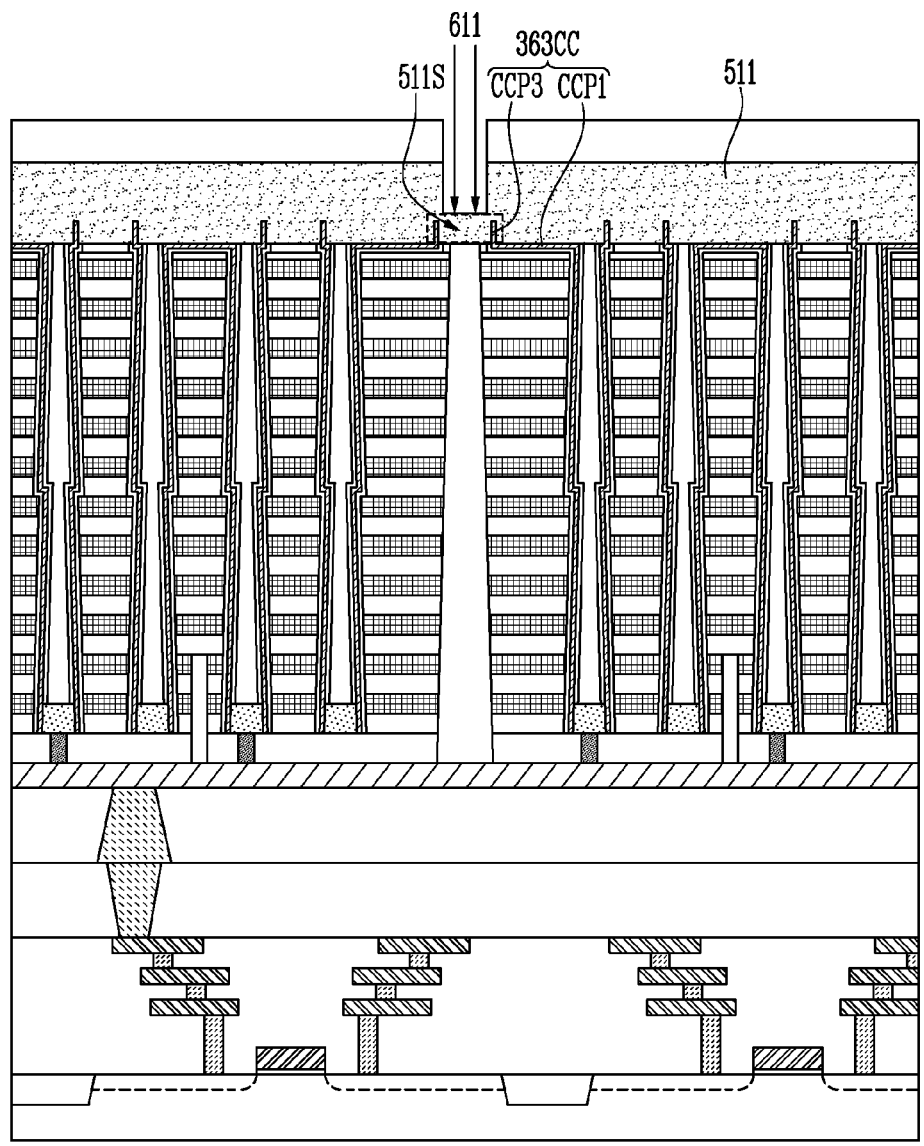

Referring to FIG. 16C, an impurity 611 of a second conductivity type may be implanted into the doped semiconductor layer 511 through the groove 515, shown in FIG. 16B. The second conductivity type impurity 611 may be provided to form a source area 511S in the doped semiconductor layer 511. The second conductivity type impurity 611 may have an n-type that is different from the first conductivity type. The impurity 611 of the second conductivity type may diffuse into a portion of the channel connection portion 363CC that is adjacent to the source area 511S.

Figure 16D:
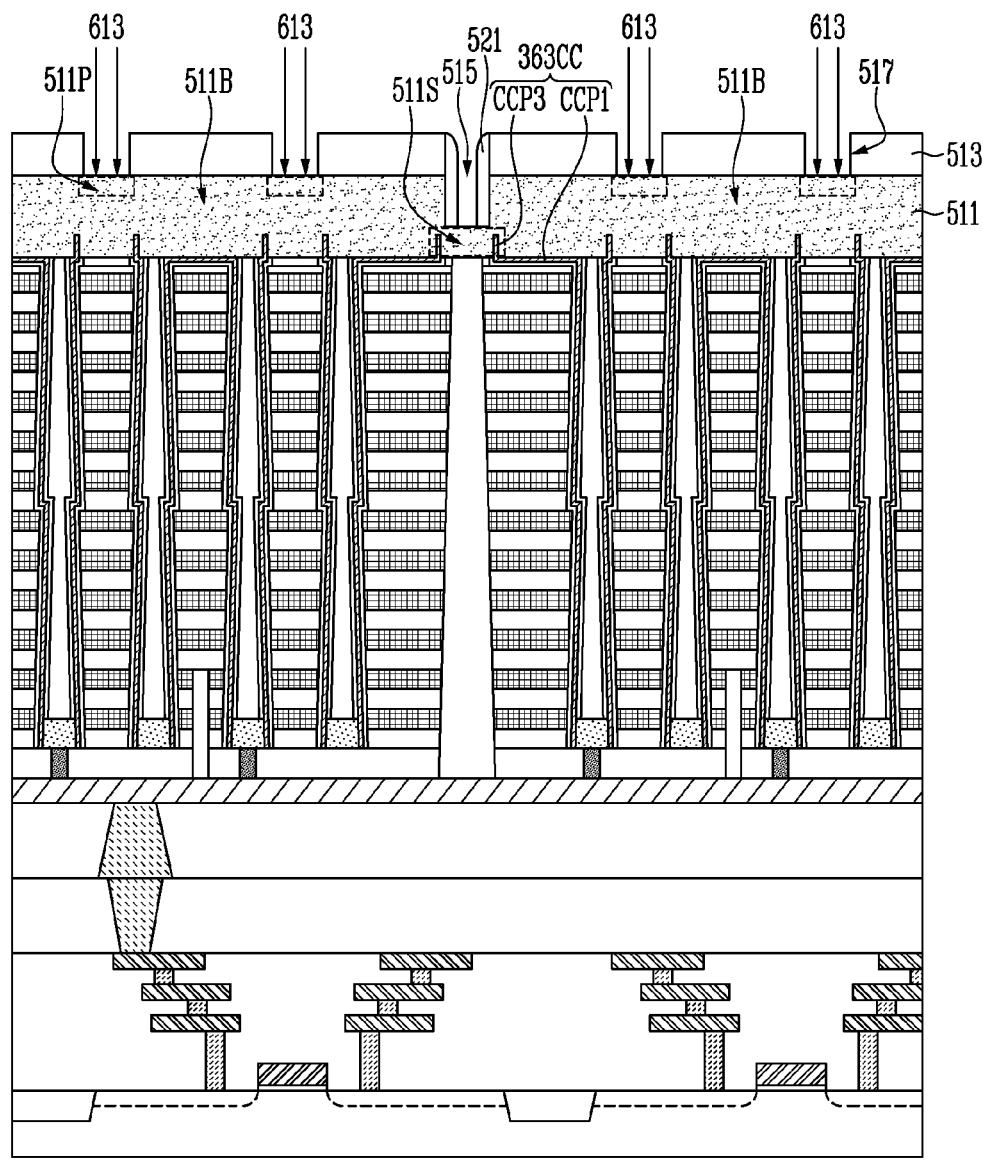

Referring to FIG. 16D, a spacer insulating layer 521 may be formed on a sidewall of the groove 515. The spacer insulating layer 521 may be removed from the bottom surface of the groove 515 to open the source area 511S.

Subsequently, a contact hole 517 that passes through the second insulating layer 513 may be formed. Thereafter, a pickup area 511P may be formed on a surface of the doped semiconductor layer 511 that is exposed through the contact hole 517. The pickup area 511P may be formed by implanting a second impurity 613 of the first conductivity type into the surface of the doped semiconductor layer 511 through the contact hole 517. The second impurity 613 may be doped into the pickup area 511P having a second concentration that is higher than the first concentration of the first impurity for the well area. The second impurity 613 may be a p-type impurity for providing a well pickup.

A remaining area of the doped semiconductor layer 511, excluding the pickup area 511P and the source area 511S, may be defined as a body area 5116. The body area 5116 that includes the p-type impurity may be used as a well area.

Figure 16E:
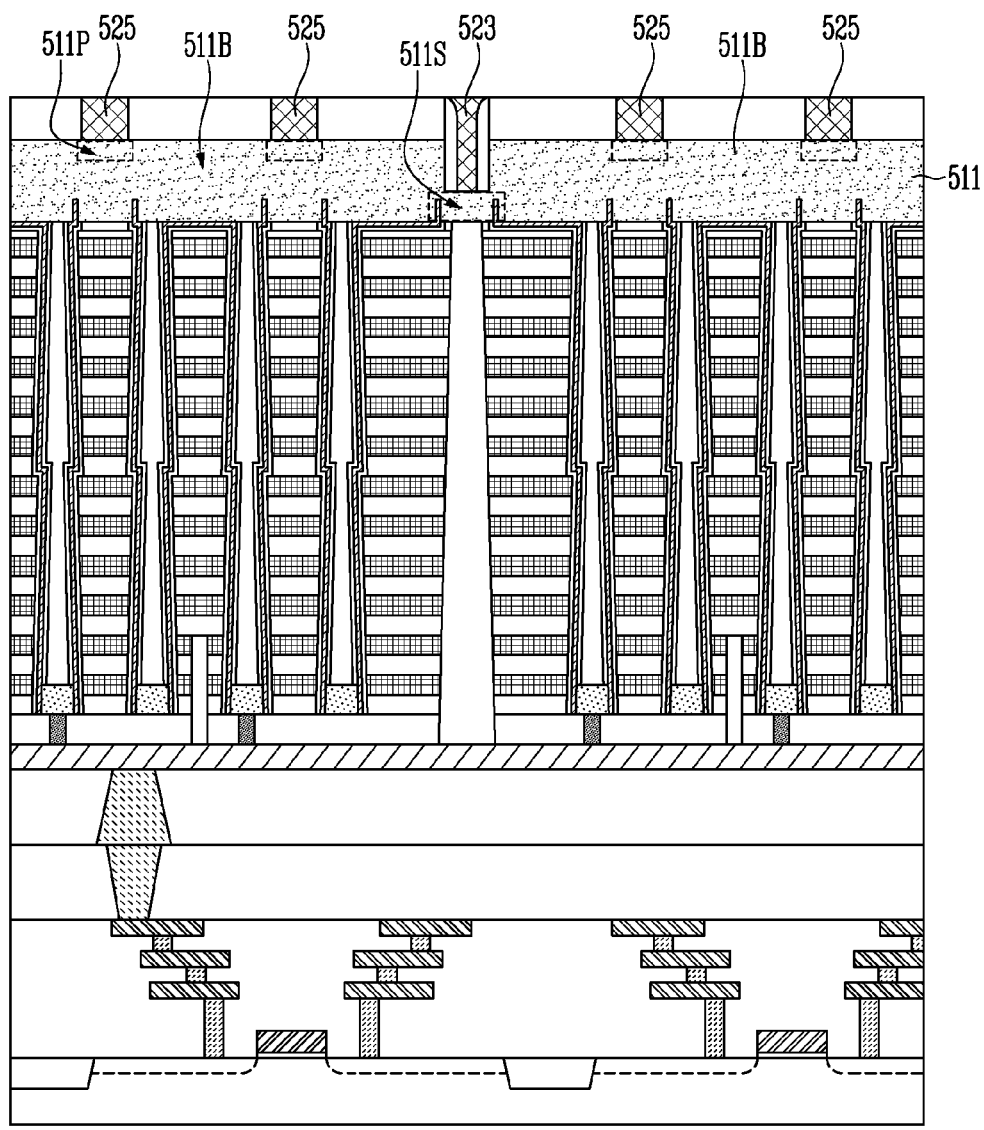

Referring to FIG. 16E, the groove 515 and the contact hole 517, shown in FIG. 16D, may be filled with a conductive material. Accordingly, a first conductive contact 523 that is in contact with the source area 511S and a second conductive contact 525 that is in contact with the pickup area 511P may be formed.

The semiconductor memory device, described with reference to FIGS. 4 and 7, may be formed through the processes that are shown in FIGS. 11A, 11B, 12A to 12E, 13, 14, 15A to 15D, and 16A to 16E.

Figure 17A:
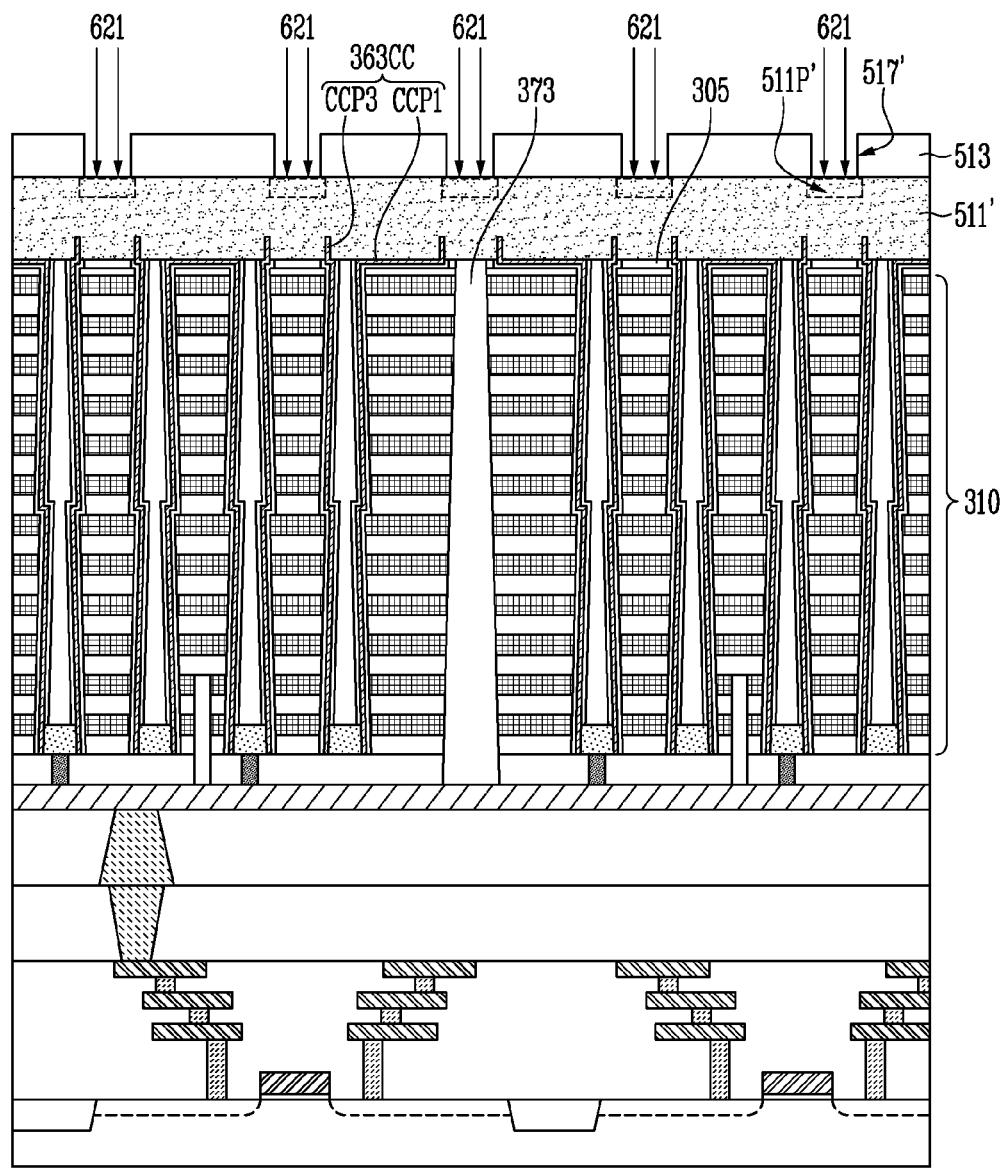
FIGS. 17A and 17B are cross-sectional views illustrating a subsequent process according to an embodiment performed after a process shown in FIG. 15D.
Figure 17A:
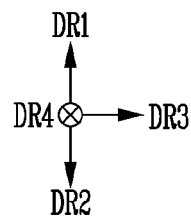
Figure 17B:
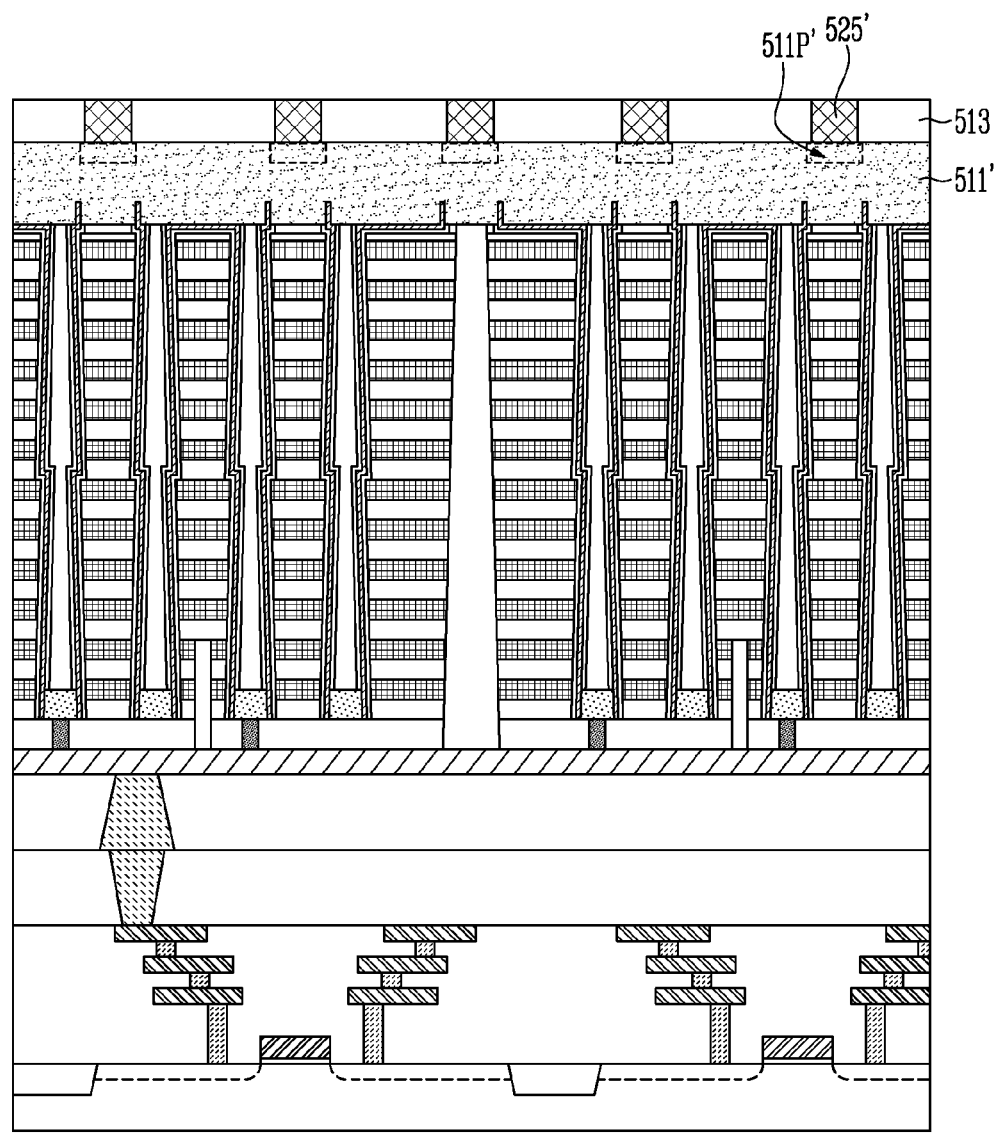

FIGS. 17A and 17B are cross-sectional views illustrating a subsequent process according to an embodiment performed after the process, shown in FIG. 15D. Hereinafter, repetitive description of the same configurations as those of FIGS. 16A to 16D has been omitted.

Referring to FIG. 17A, a doped semiconductor layer 511' may be formed over the exposed channel connection portion 363CC through the process described with reference to FIG. 15D. The doped semiconductor layer 511' may be in contact with the first connection portion CCP1 and the third connection portion CCP3 of the channel connection portion 363CC.

The doped semiconductor layer 511' may include an n-type impurity for the source area as a majority carrier. As an embodiment, the doped semiconductor layer 511' may be formed of an n-type doped silicon layer. The doped semiconductor layer 511' may include an n-type impurity having a first concentration.

Subsequently, the second insulating layer 513 may be formed over the doped semiconductor layer 511'. Thereafter, a plurality of contact holes 517' that passes through the second insulating layer 513 may be formed. The plurality of contact holes 517' may include a contact hole that overlaps with the gate stack 310 and a contact hole that overlaps with the slit insulating layer 373.

Thereafter, an n-type impurity 621 may be implanted into a surface of the doped semiconductor layer 511', which is exposed through the plurality of contact holes 517', having a second concentration that is higher than the first concentration. Accordingly, a pickup area 511P' for source pickup may be formed.

Referring to FIG. 17B, the plurality of contact holes 517', shown in FIG. 17A, may be filled with a conductive material. Accordingly, a plurality of conductive contacts 525' that are in contact with the pickup area 511P' may be formed.

The semiconductor memory device, described with reference to FIG. 8, may be formed through the processes that are shown in FIGS. 11A, 11B, 12A to 12E, 13, 14, 15A to 15D, 17A, and 17B.

Figure 18A:
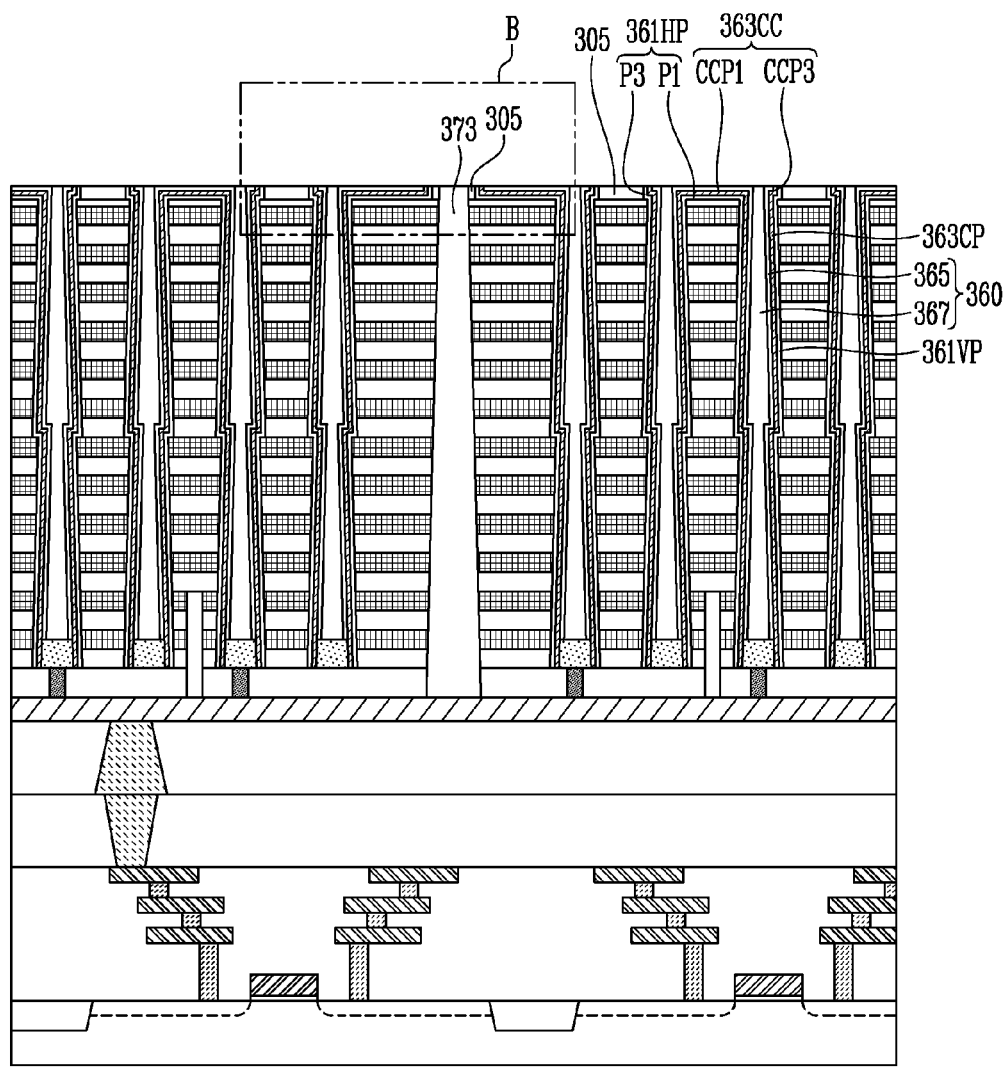
FIGS. 18A, 18B, and 19 are cross-sectional views illustrating a process of exposing a channel connection portion according to an embodiment of the present disclosure.
Figure 18B:
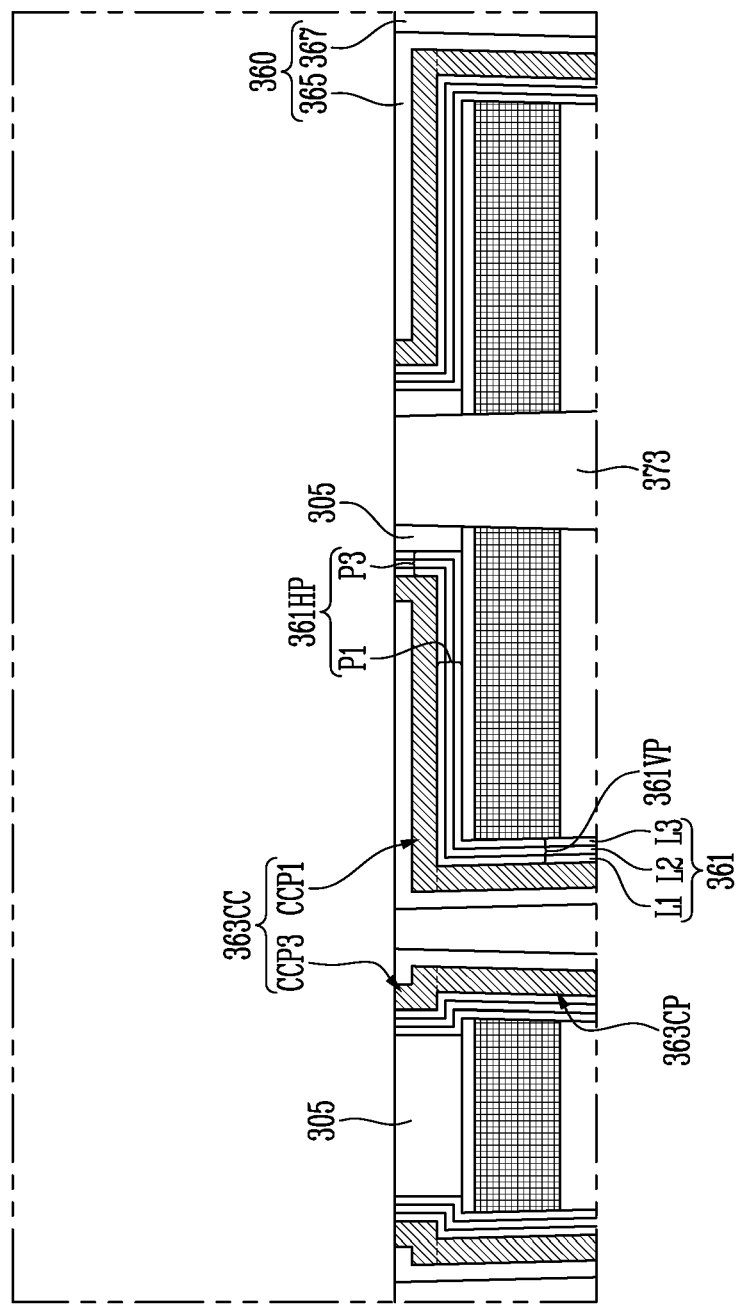
Figure 19:
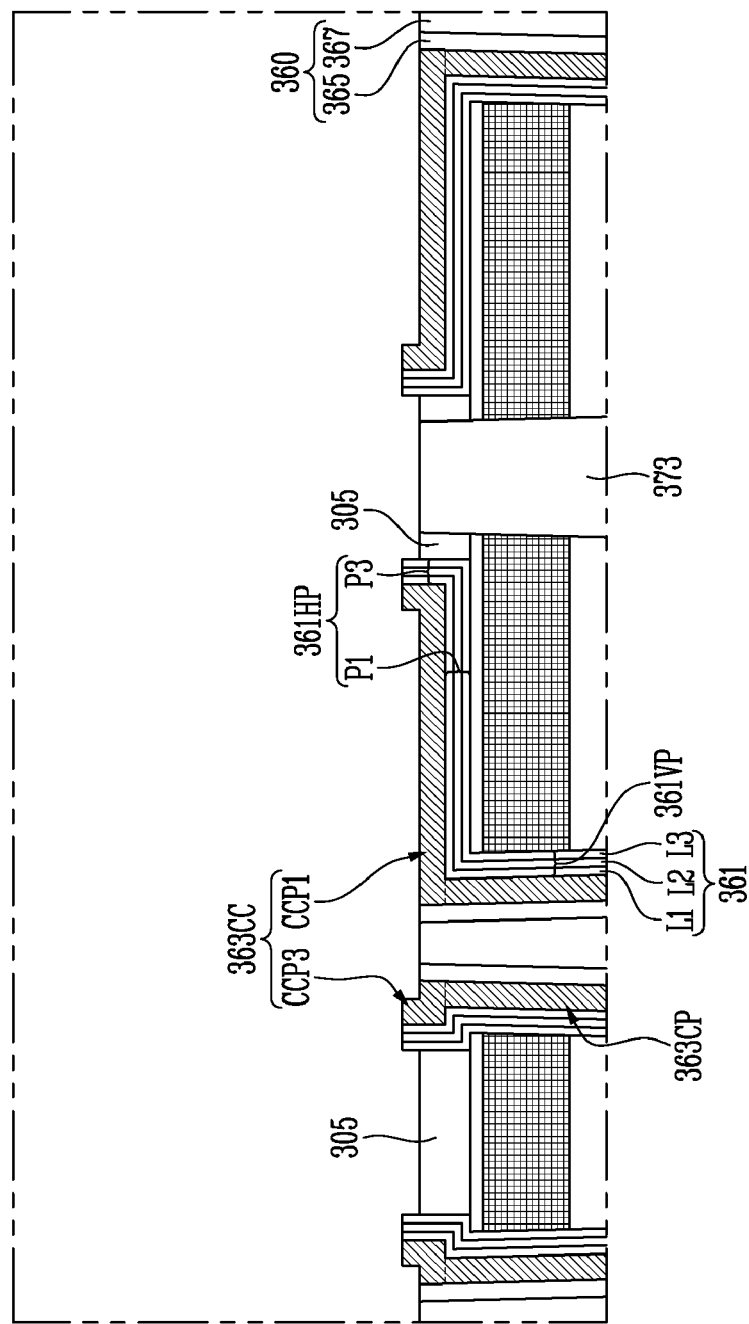

FIGS. 18A, 18B, and 19 are cross-sectional views illustrating a process of exposing a channel connection portion according to an embodiment of the present disclosure.

FIG. 18A illustrates a process performed after performing the processes that is described with reference to FIGS. 11A, 11B, 12A to 12E, 13 and 14. FIG. 18B is an enlarged cross-sectional view of an area B, shown in FIG. 18A. Hereinafter, repetitive description of the same configurations as those shown in FIGS. 11A, 11B, 12A to 12E, 13 and 14 has been omitted.

Referring to FIGS. 18A and 18B, after the bonding process that are described with reference to FIG. 14, the lower structure 301 shown in FIG. 14 may be removed. Accordingly, the horizontal portion 361HP of the memory layer 361, shown in FIG. 14, may be exposed.

Subsequently, a portion of the horizontal portion 361HP and a portion of the channel connection portion 363CC may be removed to expose the core insulating structure 360. A portion of the horizontal portion 361HP and a portion of the channel connection portion 363CC may be removed through CMP. At this time, a height of a remaining channel connection portion 363CC and a height of the horizontal portion 361HP may be changed based on the amount of the horizontal portion 361HP and the channel connection portion 363CC that are removed. As an embodiment, the second connection portion CCP2 of the channel connection portion 363CC and the second portion P2 of the horizontal portion 361HP, shown in FIG. 14, may be removed, and a portion of the third connection portion CCP3 and a portion of the third portion P3 may also be removed. At this time, a portion of the core insulating structure 360 may be removed to expose a portion of the buffer layer 365 that is adjacent to the first connection portion CCP1, and a portion of the support 305 and a portion of the slit insulating layer 373 may be removed.

During the above-described CMP process, the first connection portion CCP1 of the channel connection portion 363CC and the first portion P1 of the horizontal portion 361HP may be protected by the buffer layer 365 of the core insulating structure 360. The channel pillar 363CP and the vertical portion 361VP may be maintained without loss.

As described with reference to FIG. 7, the memory layer 361 may include a tunnel insulating layer L1, a data storage layer L2, and a blocking insulating layer L3. At least one of the tunnel insulating layer L1, the data storage layer L2, and the blocking insulating layer L3 may have an etch selectivity that is different from that of the buffer layer 365. As an embodiment, the data storage layer L2 may include silicon nitride, and the buffer layer 365 may include oxide.

Referring to FIG. 19, a portion of the buffer layer 365 may be etched to expose the first connection portion CCP1 of the channel connection portion 363CC. At this time, a portion of the gap fill layer 367, a portion of the support 305, and a portion of the slit insulating layer 373 may be removed.

During the above-described etching process, the first portion P1 of the horizontal portion 361HP may be protected by the first connection portion CCP1 of the channel connection portion 363CC, and the vertical portion 361VP may be maintained without loss. Because at least one of the tunnel insulating layer L1, the data storage layer L2, and the blocking insulating layer L3 has the etch selectivity that is different from that of the buffer layer 365, the third portion P3 of the horizontal portion 361HP may remain. Although not shown in the drawing, heights of the tunnel insulating layer L1, the data storage layer L2, and the blocking insulating layer L3 that configures the third portion P3 may be different from each other. Accordingly, a surface of the third portion P3 may have unevenness.

Figure 20:
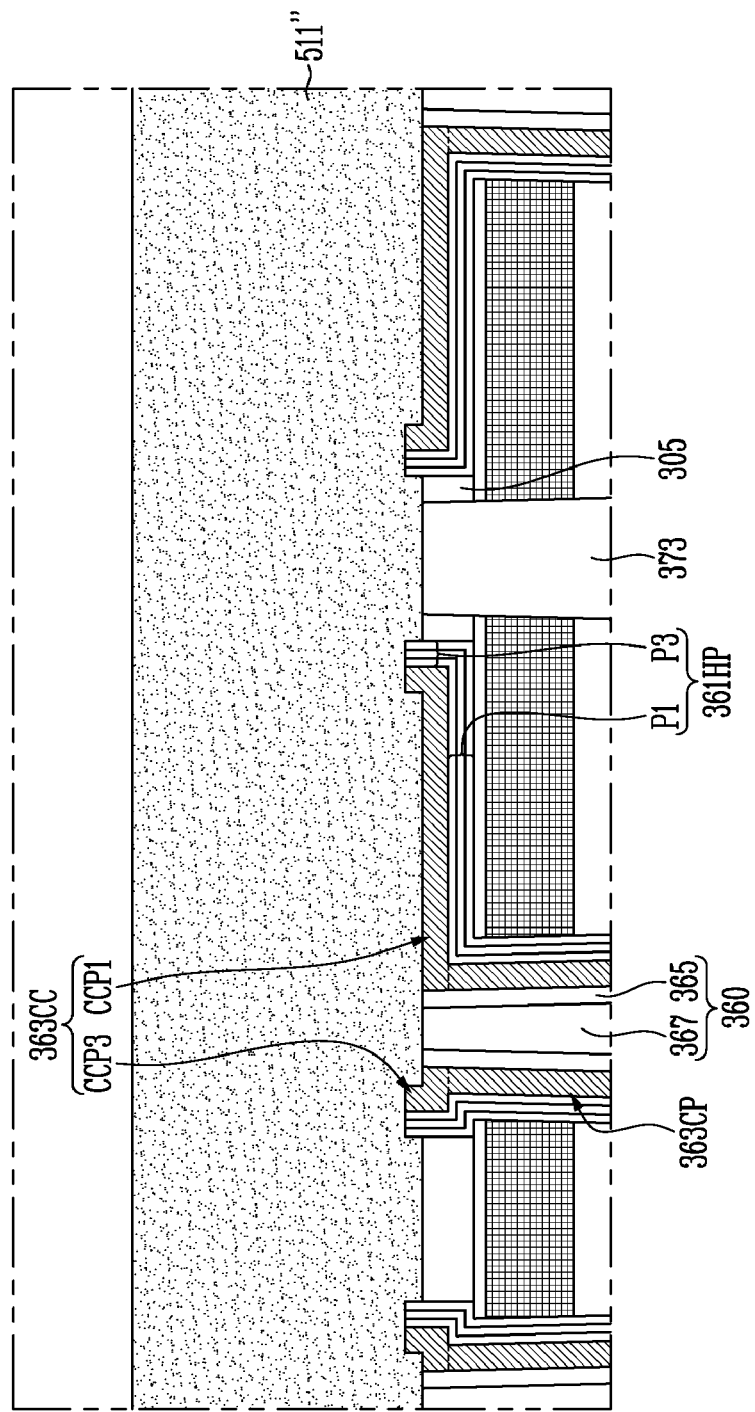
FIG. 20 is a cross-sectional view illustrating a subsequent process according to an embodiment performed after a process shown in FIG. 19.

FIG. 20 is a cross-sectional view illustrating a subsequent process according to an embodiment performed after the process shown in FIG. 19.

Referring to FIG. 20, a doped semiconductor layer 511" may be formed over the channel connection portion 363CC provided through the process that is shown in FIG. 19. The third portion P3 of the horizontal portion 361HP may remain between the doped semiconductor layer 511" and the third connection portion CCP3.

The doped semiconductor layer 511" may include a surface that is in contact with the first connection portion CCP1 and the third connection portion CCP3 of the channel connection portion 363CC.

The doped semiconductor layer 511" may include at least one of an n-type impurity and a p-type impurity. As an embodiment, the doped semiconductor layer 511" may include a p-type impurity for providing a well area as a majority carrier. At this time, the subsequent processes, described with reference to FIGS. 16B to 16E, may be performed. Accordingly, the semiconductor memory device, described with reference to FIG. 9, may be provided. As another embodiment, the doped semiconductor layer 511" may include an n-type impurity for providing a source area as a majority carrier. At this time, the subsequent processes, described with reference to FIGS. 17A and 17B, may be performed. Accordingly, the semiconductor memory device, described with reference to FIG. 10, may be provided.

Figure 21:
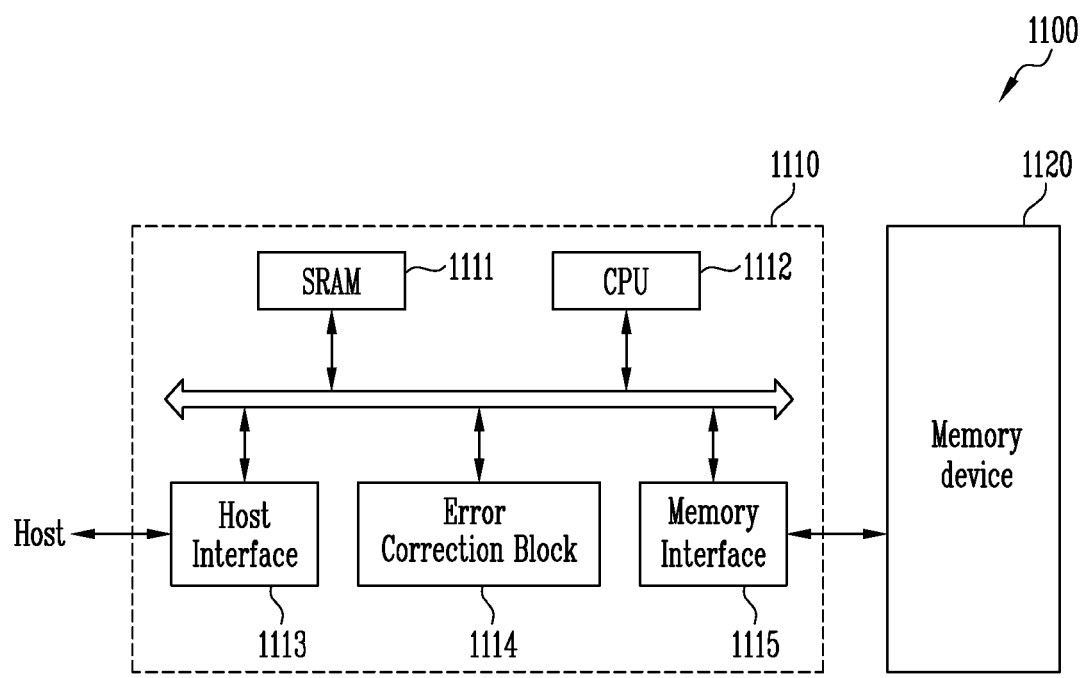
FIG. 21 is a block diagram illustrating a configuration of a memory system according to an embodiment of the present disclosure.

FIG. 21 is a block diagram illustrating a configuration of a memory system according to an embodiment of the present disclosure.

Referring to FIG. 21, the memory system 1100 includes a memory device 1120 and a memory controller 1110.

The memory device 1120 may be a multi-chip package having a plurality of flash memory chips. The memory device 1120 may include a memory cell array that includes a channel layer having a channel pillar that passes through a gate stack and a memory layer having a vertical portion between the channel layer and the gate stack. The channel layer may include a channel connection portion that extends from the channel pillar to overlap with the gate stack, and the channel connection portion may be covered with a doped semiconductor layer and may be in contact with the doped semiconductor layer to be connected to the doped semiconductor layer. The memory layer may include a horizontal portion between the channel connection portion and the doped semiconductor layer.

The memory controller 1110 may be configured to control the memory device 1120 and may include a static random access memory (SRAM) 1111, a central processing unit (CPU) 1112, a host interface 1113, an error correction block 1114, and a memory interface 1115. The SRAM 1111 may be used as an operation memory of the CPU 1112, the CPU 1112 may perform an overall control operation for data exchange of the memory controller 1110, and the host interface 1113 may include a data exchange protocol of a host that is connected to the memory system 1100. The error correction block 1114 may detect an error that is included in data that is read from the memory device 1120 and may correct the detected error. The memory interface 1115 may perform interfacing with the memory device 1120. The memory controller 1110 may further include a read only memory (ROM) that stores code data for interfacing with the host.

The above-described memory system 1100 may be a memory card or a solid state drive (SSD) in which the memory device 1120 and the memory controller 1110 are combined. For example, when the memory system 1100 is the SSD, the memory controller 1110 may communicate with the outside (for example, the host) through one of various interface protocols such as a universal serial bus (USB), a multimedia card (MMC), a peripheral component interconnection-express (PCI-E), a serial advanced technology attachment (SATA), a parallel advanced technology attachment (PATA), a small computer system interface (SCSI), an enhanced small disk interface (ESDI), and integrated drive electronics (IDE).

Figure 22:
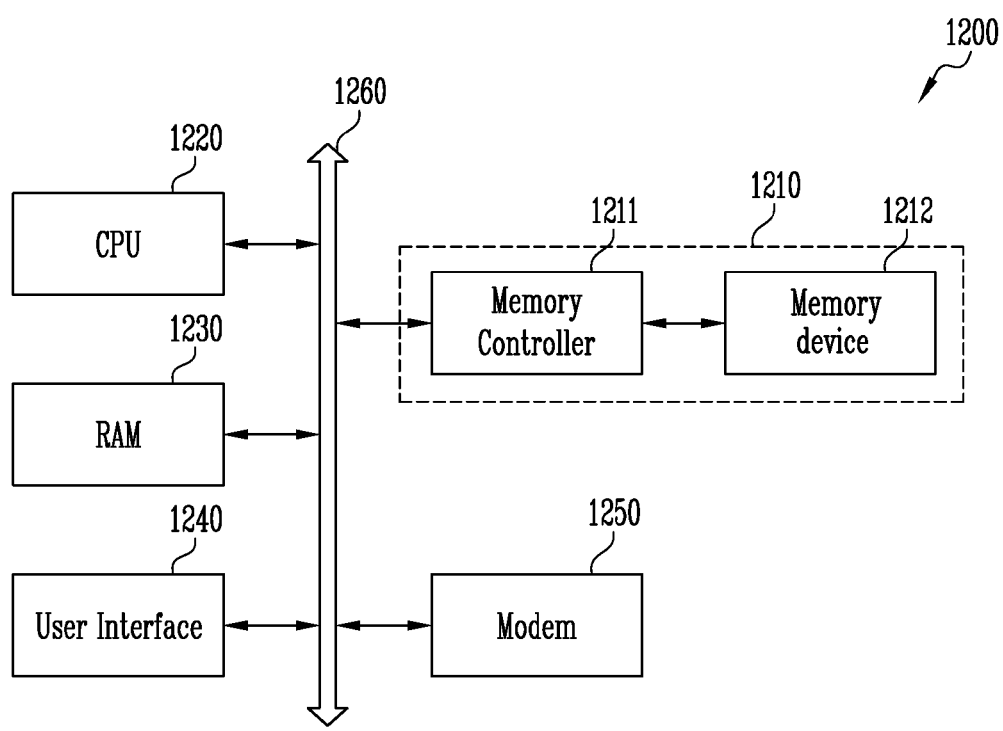
FIG. 22 is a block diagram illustrating a configuration of a computing system according to an embodiment of the present disclosure.

FIG. 22 is a block diagram illustrating a configuration of a computing system according to an embodiment of the present disclosure.

Referring to FIG. 22, the computing system 1200 may include a CPU 1220, a random access memory (RAM) 1230, a user interface 1240, a modem 1250, and a memory system 1210 electrically connected to a system bus 1260. When the computing system 1200 is a mobile device, a battery for supplying an operation voltage to the computing system 1200 may be further included, and an application chipset, an image processor, a mobile DRAM, and the like may be further included.

The memory system 1210 may include a memory device 1212 and a memory controller 1211. The memory device 1212 may have the same configuration as the memory device 1120 described above with reference to FIG. 21. The memory controller 1211 may have the same configuration as the memory controller 1110 described with reference to FIG. 21.

According to embodiments of the present disclosure, a phenomenon in which the vertical portion of the memory layer is lost may be avoided through the horizontal portion of the memory layer. Accordingly, current leakage due to loss of the vertical portion of the memory layer may also be avoided, improving the operational reliability of the semiconductor memory device.

What is claimed is:

1. A semiconductor memory device comprising:
   a gate stack, including a plurality of conductive patterns stacked and spaced apart from each other;
   a channel layer including a plurality of channel pillars that pass through the gate stack and a channel connection portion that extends from each of the plurality of channel pillars to overlap with the gate stack;
   a memory layer including a vertical portion between the plurality of channel pillars and the gate stack and a horizontal portion that extends from the vertical portion between the gate stack and the channel connection portion; and
   a doped semiconductor layer disposed over the channel connection portion,
   wherein the doped semiconductor layer extends to reach each of the channel connection portion and the memory layer.

2. The semiconductor memory device of claim 1, wherein the doped semiconductor layer comprises:
   a well area doped with an impurity of a first conductivity type; and
   a source area doped with an impurity of a second conductivity type that is different from the first conductivity type.

3. The semiconductor memory device of claim 2, wherein the channel connection portion comprises:
   a first doped area contacting the well area, the first doped area being doped with the impurity of the first conductivity type; and
   a second doped area contacting the source area, the second doped area being doped with the impurity of the second conductivity type.

4. The semiconductor memory device of claim 1, wherein the doped semiconductor layer comprises:
   a body area including a first impurity of a first concentration; and
   a pickup area including a second impurity of a second concentration that is higher than the first concentration, and
   wherein the pickup area is formed over a surface of the doped semiconductor layer.

5. The semiconductor memory device of claim 4, wherein the first impurity and the second impurity are p-type.

6. The semiconductor memory device of claim 4, wherein the first impurity and the second impurity are n-type.

7. The semiconductor memory device of claim 1, wherein, in a plane view, the channel connection portion includes a plurality of holes that are arranged on a plane that crosses the plurality of channel pillars.

8. The semiconductor memory device of claim 7, further comprising:
   a plurality of supports disposed inside the plurality of holes,
   wherein the memory layer extends between the plurality of supports and the channel connection portion.

9. The semiconductor memory device of claim 1, further comprising:
   a peripheral circuit structure overlapped by the doped semiconductor layer with the gate stack interposed therebetween.

10. A semiconductor memory device comprising:
    a first gate stack;
    a second gate stack spaced apart from the first gate stack;
    a slit insulating layer between the first gate stack and the second gate stack;
    a first channel layer including a plurality of first channel pillars that pass through the first gate stack and a first channel connection portion that extends from the plurality of first channel pillars to overlap with the first gate stack;
    a second channel layer including a plurality of second channel pillars that pass through the second gate stack and a second channel connection portion that extends from the plurality of second channel pillars to overlap with the second gate stack;
    a first memory layer including a first vertical portion between the plurality of first channel pillars and the first gate stack and a first horizontal portion extending from the first vertical portion between the first gate stack and the first channel connection portion;
    a second memory layer including a second vertical portion between the plurality of second channel pillars and the second gate stack and a second horizontal portion extending from the second vertical portion between the second gate stack and the second channel connection portion; and
    a doped semiconductor layer disposed over the slit insulating layer, wherein the doped semiconductor layer extends wider than the slit insulating layer to be in contact with the first channel connection portion and the second channel connection portion.

11. The semiconductor memory device of claim 10, wherein the doped semiconductor layer comprises:
    a well area doped with an impurity of a first conductivity type; and a source area doped with an impurity of a second conductivity type that is different from the first conductivity type.

12. The semiconductor memory device of claim 11, wherein the well area overlaps with and is connected to each of the first channel connection portion and the second channel connection portion.

13. The semiconductor memory device of claim 11, wherein the source area is defined between the first channel connection portion and the second channel connection portion and is connected to each of the first channel connection portion and the second channel connection portion.

14. The semiconductor memory device of claim 11, wherein the well area is disposed on both sides of the slit insulating layer,
   wherein the source area overlaps with the slit insulating layer, and
   wherein each of the first channel connection portion and the second channel connection portion comprises:
      a first doped area contacting the well area and doped with the impurity of the first conductivity type; and
      a second doped area contacting the source area and doped with the impurity of the second conductivity type.

15. The semiconductor memory device of claim 10, wherein the doped semiconductor layer includes a groove that overlaps with the slit insulating layer.

16. The semiconductor memory device of claim 15, further comprising:
   a conductive contact contacting a partial area of the doped semiconductor layer, the partial area defining a bottom surface of the groove, the conductive contact disposed in a central area of the groove; and
   a spacer insulating layer disposed between a sidewall of the groove and the conductive contact.

17. The semiconductor memory device of claim 10, wherein the doped semiconductor layer comprises:
   a body area including a first impurity of a first concentration; and
   a pickup area including a second impurity of a second concentration, the second concentration being higher than the first concentration, and
   the pickup area is formed over a surface of the doped semiconductor layer.

18. The semiconductor memory device of claim 17, wherein the first impurity and the second impurity are p-type.

19. The semiconductor memory device of claim 17, wherein the first impurity and the second impurity are n-type.

* * * * *